(12) United States Patent
Van Wijmeersch et al.

(10) Patent No.: US 8,653,557 B2
(45) Date of Patent: Feb. 18, 2014

(54) HIGH HOLDING VOLTAGE ELECTROSTATIC DISCHARGE (ESD) DEVICE

(75) Inventors: Sven Van Wijmeersch, Brakel (BE); Olivier Marichal, Sint-Niklaas (BE)

(73) Assignee: Sofics BVBA, Gistel (BE)

( * ) Notice: Subject to any disclaimer, the term of this patent is extended or adjusted under 35 U.S.C. 154(b) by 400 days.

(21) Appl. No.: 13/029,560

(22) Filed: Feb. 17, 2011

(65) Prior Publication Data
US 2011/0204415 A1     Aug. 25, 2011

Related U.S. Application Data

(60) Provisional application No. 61/306,658, filed on Feb. 22, 2010.

(51) Int. Cl.
*H01L 29/66* (2006.01)
(52) U.S. Cl.
USPC .................................. 257/173; 257/E29.181
(58) Field of Classification Search
USPC ................... 257/111, 115, 173, 175, E29.181
See application file for complete search history.

(56) References Cited

U.S. PATENT DOCUMENTS

| | | | |
|---|---|---|---|
| 4,777,518 A | 10/1988 | Mihara et al. | |
| 4,939,616 A | 7/1990 | Rountree | |
| 5,274,262 A | 12/1993 | Avery | |
| 5,343,053 A | 8/1994 | Avery | |
| 5,465,189 A | 11/1995 | Polgreen et al. | |
| 5,493,133 A | 2/1996 | Duvvury et al. | |
| 5,506,742 A | 4/1996 | Marum | |
| 5,747,837 A | 5/1998 | Iwase et al. | |
| 5,962,876 A | 10/1999 | Yu | |
| 6,147,369 A | 11/2000 | Chen et al. | |
| 6,172,404 B1 | 1/2001 | Chen et al. | |
| 6,281,527 B1 | 8/2001 | Chen | |
| 6,420,221 B1 * | 7/2002 | Lee et al. | 438/199 |
| 6,433,368 B1 | 8/2002 | Vashchenko et al. | |
| 6,441,439 B1 | 8/2002 | Huang et al. | |
| 6,570,226 B1 | 5/2003 | Groeseneken et al. | |
| 6,803,633 B2 | 10/2004 | Mergens et al. | |
| 6,822,294 B1 | 11/2004 | Vashchenko et al. | |
| 7,064,393 B2 | 6/2006 | Mergens et al. | |
| 7,123,054 B2 | 10/2006 | Satou et al. | |
| 2004/0100745 A1 | 5/2004 | Chen et al. | |
| 2007/0002508 A1 | 1/2007 | Vanysacker et al. | |
| 2009/0244797 A1 | 10/2009 | Sawahata | |
| 2010/0006890 A1 | 1/2010 | Wijmeersch | |

* cited by examiner

*Primary Examiner* — Selim Ahmed
(74) *Attorney, Agent, or Firm* — Volpe and Koenig, P.C.

(57) ABSTRACT

A high holding voltage (HV) electrostatic discharge (ESD) protection circuit comprises a silicon controlled rectifier (SCR) device and compensation regions located within the length between the anode and cathode (LAC) of the SCR device which increase the holding voltage of the SCR device. The compensation regions may introduce negative feedback mechanisms into the SCR device which may influence the loop gain of the SCR and cause it to reach regenerative feedback at a higher holding voltage.

20 Claims, 22 Drawing Sheets

HIGH HOLDING VOLTAGE ELECTROSTATIC DISCHARGE (ESD) DEVICE

CROSS REFERENCE TO RELATED APPLICATIONS

This application claims the benefit of U.S. Provisional Application No. 61/306,658, filed Feb. 22, 2010, which is incorporated by reference as if fully set forth herein.

FIELD OF INVENTION

The present invention is related to semiconductor devices.

BACKGROUND

Silicon controlled rectifiers (SCR) are devices capable of conducting a high current at a low operating voltage. The voltage across the SCR at which it sustains current flow is referred to as the holding voltage. SCRs are often used for electrostatic discharge protection (ESD) in semiconductors. For a classical SCR the holding voltage is typically around 1.2V. When an SCR is triggered by an ESD event, it conducts current from the ESD event safely, protecting the semiconductor device.

When an SCR is implemented in a system operating with a power supply voltage that is higher than 1.2V, the SCR may become latched-up. A latched-up SCR conducts current during normal operation and not just during an ESD event as a protection device. As such, the SCR may often burn out.

To solve the latch-up problem so that SCRs may be implemented in systems operating with higher power supply voltages, the holding voltage of the SCR may be increased by adding diodes in series with the SCR or by stacking multiple SCRs in series. The problem with these solutions in high voltage (HV) applications is that too many additional elements are necessary to reach a holding voltage above the supply voltage. A diode may only increase the holding voltage by 0.7 V which will require too many diodes to be practical. Likewise, it is not practical to stack as many SCRs in series as necessary. Due to the number of additional elements, the area needed to implement the diodes or SCRs is too large. Furthermore, the leakage due to the Darlington effect from the many additional devices will be too high.

Alternatively, in HV technologies other devices may be used such as Zener diodes, ground-gated n-type channel metal oxide semiconductors (GGNMOS), and resistive complementary metal oxide semiconductors (RC-MOS), however these also take up a large area and exhibit triggering problems.

A new device with a high holding voltage above the power supply voltage and a high current capability is needed.

SUMMARY

A high holding voltage (HV) electrostatic discharge (ESD) protection circuit comprises a silicon controlled rectifier (SCR) device and compensation regions located within the length between the anode and cathode (LAC) of the SCR device which may increase the holding voltage of the SCR device. The compensation regions may introduce negative feedback mechanisms into the SCR device which may influence the loop gain of the SCR and cause it to reach regenerative feedback at a higher holding voltage.

BRIEF DESCRIPTION OF THE DRAWINGS

A more detailed understanding may be had from the following description, given by way of example and to be understood in conjunction with the accompanying drawings, wherein.

DETAILED DESCRIPTION

The circuits described herein comprise wells of a conductivity type, wherein the conductivity type comprises N-type and P-type. When referred to hereinafter, a first conductivity type may be the opposite of a second conductivity type. For instance, if the first conductivity type is an N-type, the second conductivity type may be a P-type. Likewise, if the first conductivity type is a P-type, the second conductivity type may be an N-type. In the following embodiments, a circuit may be implemented with conductivity types of either arrangement. The figures may depict bipolar transistors of a specific type, however the circuits depicted in the figures may be implemented with regions of opposite conductivity type resulting in transistors of the opposite type. In this case, a PNP bipolar transistor would become an NPN bipolar transistor, and an NPN bipolar transistor would become a PNP bipolar transistor.

Figure 1:
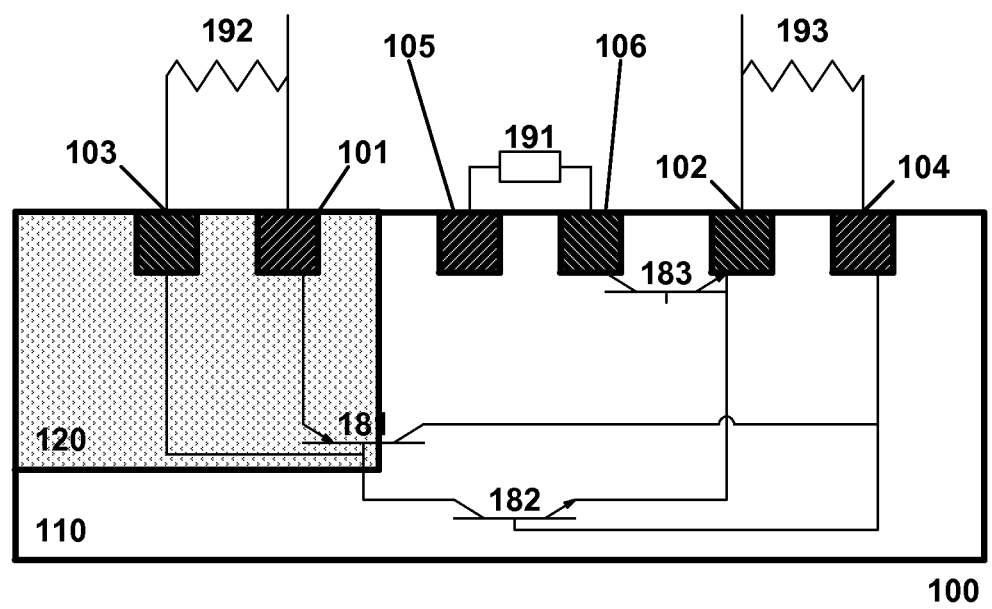
FIG. 1 shows a first embodiment of a high holding voltage (HV) electrostatic discharge (ESD) protection circuit.

In the following descriptions, common numerical designations may be used for similar, corresponding parts across multiple figures. In general, the part number will start with the figure number. For instance, anode region 101 as shown in FIG. 1 corresponds to similar anode region 501 shown in FIG. 5. Likewise, bipolar 681 formed by regions 601, 603, and 610 shown in FIG. 6 corresponds to similar bipolar 2181 formed by regions 2101, 2103, and 2110 shown in FIG. 21. In some instances for clarity of illustration or due to the orientation of the figure, bipolar transistors may not be explicitly depicted in the figures. However, it should be understood that a bipolar x82 formed from regions x02, x10, and x20 in Figure x may be similar to bipolar y82 formed from regions y02, y10, and y20 in Figure y.

One of ordinary skill in the art should recognize a region may be viewed as serving multiple functions. For instance, a well region may serve as an emitter of a first transistor and as an anode of a silicon controlled rectifier (SCR). As such, in the following descriptions, the same region may be referred to by different nomenclature depending on the context of the function it serves. As an example, one may encounter a description for an emitter 601 and later encounter a description for an anode 601 referring to the same region. The numerical designation will provide an unambiguous notation for the region under consideration while the preceding descriptor should aid the readability of the description in the context of the discussion.

FIG. 1 shows a first embodiment of a high voltage (HV) electrostatic protection (ESD) protection circuit 100. The HV ESD protection circuit 100 comprises regions 101, 104, and 105, which may be highly-doped of a first conductivity type. Regions 102, 103, and 106 may be highly-doped of a second conductivity type. Well region 110 may be of the first conductivity type and may have a lower doping level than regions 101, 104, and 105. Well region 120 may be of the second conductivity type and may have a lower doping level than regions 102, 103, and 106. Highly-doped regions 101 and 103 may be formed in well region 120, and highly-doped regions 102, 104, 105, and 106 may be formed in well region 110. The highly-doped regions 101, 102, 103, 104, 105, and 106 may be separated on the chip surface by field oxide, trench isolation, or equivalent material. A semiconductor chip may comprise other circuits in addition to the HV ESD protection circuit 100.

Regions 101 (emitter), 110 (collector), and 120 (base) may form a first bipolar device 181. Regions 102 (emitter), 110 (base), and 120 (collector) may form a second bipolar device 182 which may be the opposite type of the first bipolar device 181. Bipolars 181 and 182 may be coupled to form an SCR device. Regions 101 and 102 may be respectively called the anode and cathode of the SCR device. The spacing between these two regions may be referred to as the anode-cathode spacing (LAC). Regions 105 and 106 may be formed within the LAC. Regions 105 and 106 may be coupled by connection 191. Connection 191 may be a metal contact, via, metal line, resistor, capacitor, diode, metal oxide semiconductor (MOS) device, bipolar, control circuit, or any other electrical element or combination of elements forming a connection between regions 105 and 106. Regions 102 (emitter), 106 (collector), and 110 (base) may form a bipolar 183. Anode 101 may be coupled to region 103 through a resistive element 192. Likewise, cathode 102 may be coupled to region 104 through a resistive element 193. The well resistance of region 110 may create a resistive path that couples region 105 to region 104.

Region 101 is the emitter of bipolar 181. When the junction between regions 101 and 120 is forward biased, bipolar 181 may start to inject collector current into well 110. This current may consist of majority carriers in well 110. The current may be drawn to the cathode 102 through region 104 and resistor 193. The current through resistor 193 may create a voltage difference across the resistor 193 such that the junction between region 110 and region 102 may become forward biased. Region 102 may be the emitter of both bipolars 182 and 183. Current flowing through bipolar 182 may take the form of collector current in well 120. This current may be drawn from anode 101 through resistor 192 and region 103. The current flowing through resistor 192 may create a voltage difference across the resistor which may forward bias the junction between regions 101 and 120.

The aforementioned behavior of the current describes a positive feedback loop. Once the junctions are forward biased, for instance by an external trigger current, the positive feedback may keep the SCR device active. If feedback current is high enough to keep the junctions forward biased without the injection of continued, external trigger current, the feedback between bipolars 181 and 182 may be regenerative. The regenerative feedback may keep the SCR device active.

An SCR may sustain regenerative feedback when the product of the forward gains of the bipolars comprising the SCR, in this case bipolars 181 and 182, is greater than or equal to unity. This product is commonly referred to as loop gain. If the loop gain is greater or equal to 1, a small amount of current forced into the base of either bipolar 181 or 182 may be multiplied by the forward gain of the bipolar and injected into the base of the other bipolar. The current may then be multiplied by the forward gain of the other bipolar and injected into the base of the first bipolar. This positive feedback operation may drive the bipolars into saturation, wherein the current may not increase further. For a typical SCR device, the holding voltage across the anode and cathode may be 1.2V.

The effective forward gain of a bipolar transistor may be dependent on the collector-emitter voltage through the Early effect, wherein:

$$dI_c/dV_{ce} = I_c/|V_A|, \quad (1)$$

and wherein $V_A$ is the Early voltage, $I_c$ is the collector current, and $dI_c/dV_{ce}$ is the ratio of the change in the collector current to a change in the collector-emitter voltage. As such, an increase in the voltage applied between the anode 101 and cathode 102 may increase the loop gain, and hence the positive feedback, between bipolars 181 and 182. An increased positive feedback may increase the triggering speed of the SCR.

Regions 105 and 106 may be viewed as SCR compensation regions by increasing the holding voltage of the SCR in FIG. 1. If regions 105 and 106 were not present between the anode 101 and cathode 102 of the SCR in FIG. 1, the SCR may exhibit a typical holding voltage of 1V to 2V. Adding regions 105 and 106 may introduce a negative feedback mechanism to the SCR device by diverting current away from the SCR device. Region 102 may serve as the emitter for bipolar 183 as well as bipolar 182. Region 110 may also serve as the base for bipolars 182 and 183. As such, when bipolar 182 conducts current, bipolar 183 may also conduct current. Bipolar 183 may be made more efficient than bipolar 182 so that a relatively larger portion of emitter current may be conducted by bipolar 183 than bipolar 182. As such, less collector current of bipolar 182 may contribute to positive feedback which negatively compensates the SCR loop gain.

When bipolar 183 conducts current, the voltage at its collector 106 may be drawn towards the voltage of cathode 102. Likewise, through connection 191, the voltage of region 105 may be drawn towards the voltage of collector 106 depending on the nature of connection 191. In FIG. 1, the voltage of region 105 may be similar to the voltage of region 106. The voltage of region 105 may keep the voltage of region 110 low in an area near the collector of bipolar 181. The low voltage of region 105 may provide an alternate path for current to flow to cathode 102 rather than through region 104 or bipolar 182. The lower local voltage of region 110 may also make it more difficult for the junction of regions 110-102 to become forward-biased. As such, the gain of the SCR feedback mechanism between bipolars 181 and 182 may be reduced, which may be viewed as introducing negative feedback.

To increase the positive feedback of the SCR to counter the effects of the negative feedback introduced by regions 105 and 106, the voltage across the SCR device may be increased which may increase the forward gain of the bipolar devices. Once the positive feedback is large enough to counter the negative feedback such that the loop gain of the SCR is greater than or equal to one, the SCR may be regenerative. As such, the holding voltage of the SCR depicted in FIG. 1 may be higher due to the negative feedback introduced by regions 105 and 106.

The placement of regions 105 and 106 within the LAC of the SCR device may alter the characteristics of the SCR device by affecting the feedback cycle of the SCR device and compensating the SCR device loop gain. Placement of regions 105 and 106 between the anode 101 and cathode 102 of the SCR device significantly impacts the operation of the SCR device.

Regions 105 and 106 placed in well 110 between the anode 101 and cathode 102 may be viewed as effectively being within the base of bipolar 182. Bipolar 183 may effectively draw minority carriers from the base of bipolar 182, which may lower the forward gain of bipolar 182. Due to the directionality of the current injection by bipolar 181 into well 110 and by bipolar 182 into well 120, placement of regions 105 and 106 within the LAC as depicted in FIG. 1 has a significant effect. Overall the current may flow from anode 101 towards cathode 102. Therefore, regions 105 and 106 may be placed directly into this current path which significantly affects the operation of the SCR device. Placement of regions 105 and 106 outside of the LAC would have less of an impact on the performance of the SCR device.

Regions 105 and 106 placed inside of the LAC may enable bipolar 183 to become stronger relative to bipolar 182. If regions 105 and 106 were placed outside of the LAC, the collector of 183 would no longer be located in the base of bipolar 182. As such, bipolar 183 may have a decreased impact on the positive feedback cycle of the SCR device. Furthermore, the injection of minority carriers from region 102 into well 110 may predominantly occur in the direction of well 120 due to the majority carriers injected by bipolar 181 reaching the junction between well 110 and region 102 from the direction of well 120. If regions 105 and 106 were placed outside of the LAC, bipolar 182 would be favored over bipolar 183.

Regions 105 and 106 placed within the LAC enable region 105 to be placed within close proximity to the collector junction of bipolar 181 which helps to minimize the well resistance between the collector and region 105. Conversely, placing region 105 outside of the LAC increases the distance between region 105 and the collector junction of bipolar 181. The collector junction of bipolar 181 injects current into well 110. The increased distance may result in an increased well resistance between the collector junction of bipolar 181 and region 105 which may result in a higher voltage build-up across said resistance. The higher voltage build-up would allow the junction between well 110 and region 102 to more easily become forward-biased. Hence, placement of regions 105 and 106 outside of the LAC reduces their effectiveness by reducing their contribution to the negative feedback of the SCR device.

If regions 105 and 106 were placed outside of the LAC, the positive feedback of the SCR may be relatively stronger than the negative feedback impact of regions 105 and 106. Such a scenario may lead to a runaway effect. The current may prefer the direct path between anode 101 and cathode 102 than a path through regions 105 and 106, which may lessen their impact. The preference for the direct path may result in increasingly stronger positive feedback, further reducing the impact of regions 105 and 106. As such, placing regions 105 and 106 within the LAC may be preferable to increase the holding voltage.

Figure 2:
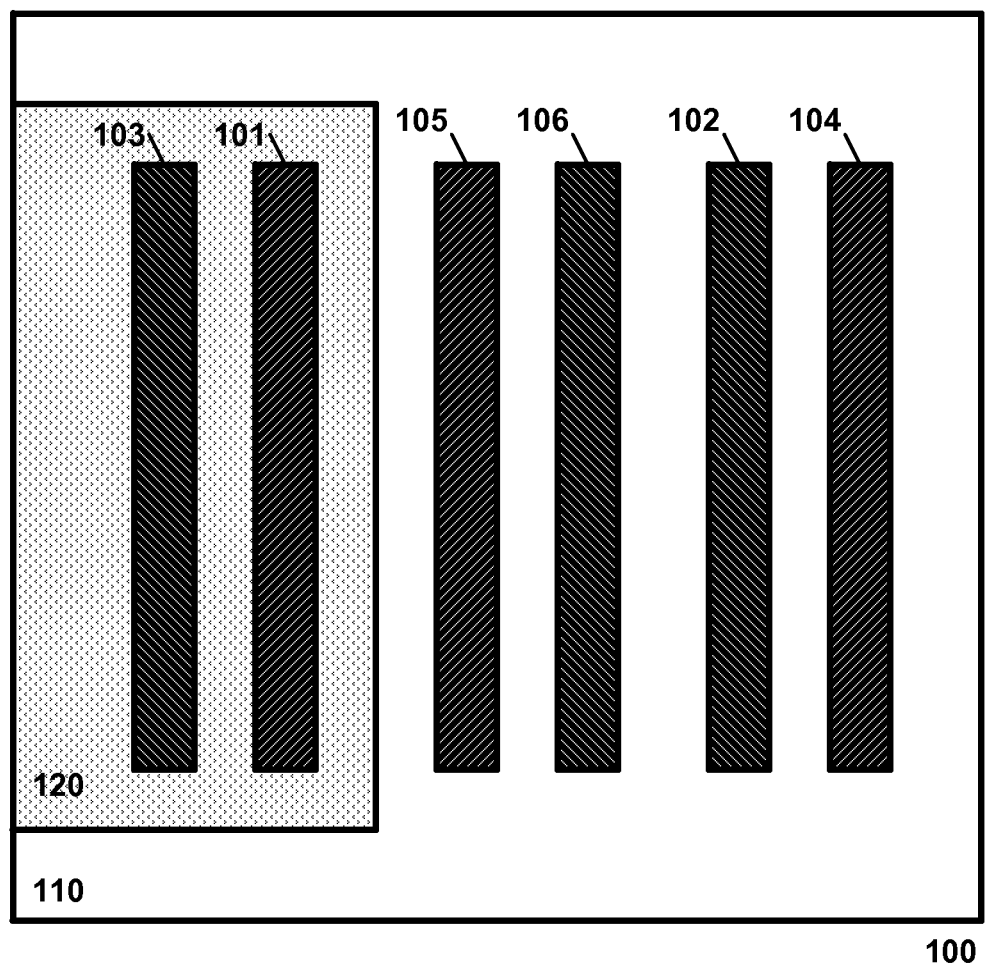
FIG. 2 shows a top view of the first embodiment of the HV ESD protection circuit shown in FIG. 1.

FIG. 2 shows a top-view of the embodiment of the HV ESD protection circuit 100 shown in FIG. 1. Though not shown in FIG. 2, regions 101, 110, and 120 may form bipolar device 181; regions 102, 110, and 120 may form bipolar device 182; and regions 102, 106, and 110 may form bipolar 183. Regions 101, 102, 103, and 104, 110, and 120 may form an SCR device. Compensation regions 105 and 106 may introduce negative feedback effects which may increase the holding voltage of the SCR device. The width and length of regions 101-106 may be different for each region than depicted in FIGS. 1 and 2.

Figure 3:
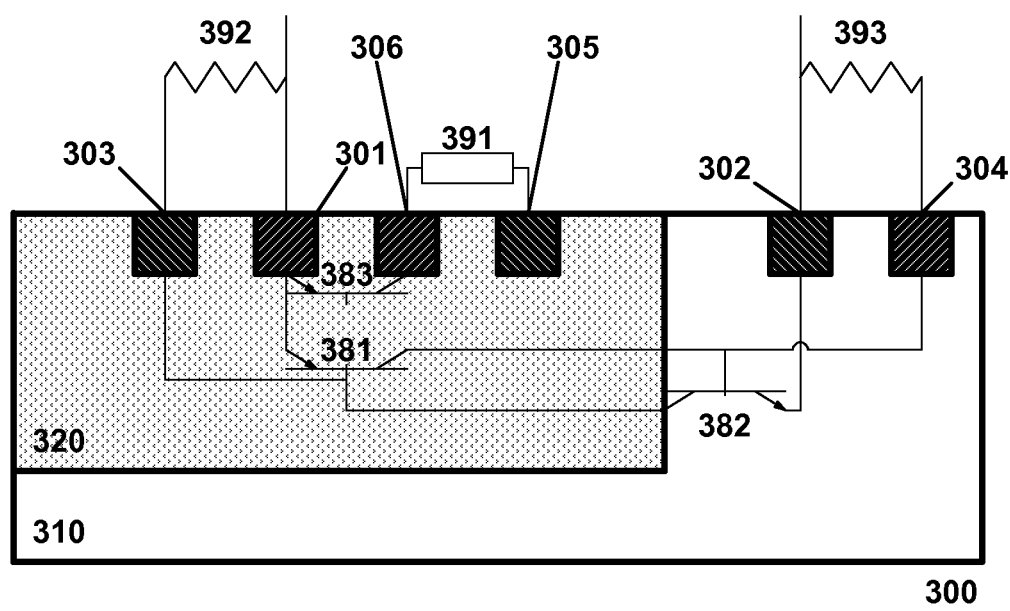
FIG. 3 shows a second embodiment of a HV ESD protection circuit comprising silicon controlled rectifier (SCR) compensation regions in an alternate well.

FIG. 3 shows an embodiment of a HV ESD protection circuit 300 wherein compensation regions 305 and 306 may be placed within well region 320. Region 305 may be highly-doped of the second conductivity type and region 306 may be highly-doped of the first conductivity type. Regions 301, 306, and 320 form bipolar transistor 383 which may compete with bipolar 381 and may reduce the effective forward gain of bipolar 381 rather than bipolar 382, which is similarly shown in FIG. 1. One should recognize that various implementations which may be applied to region 310 may also be applied to region 320. The doping levels of regions 310 and 320 may affect the resulting holding voltage.

Figure 4:
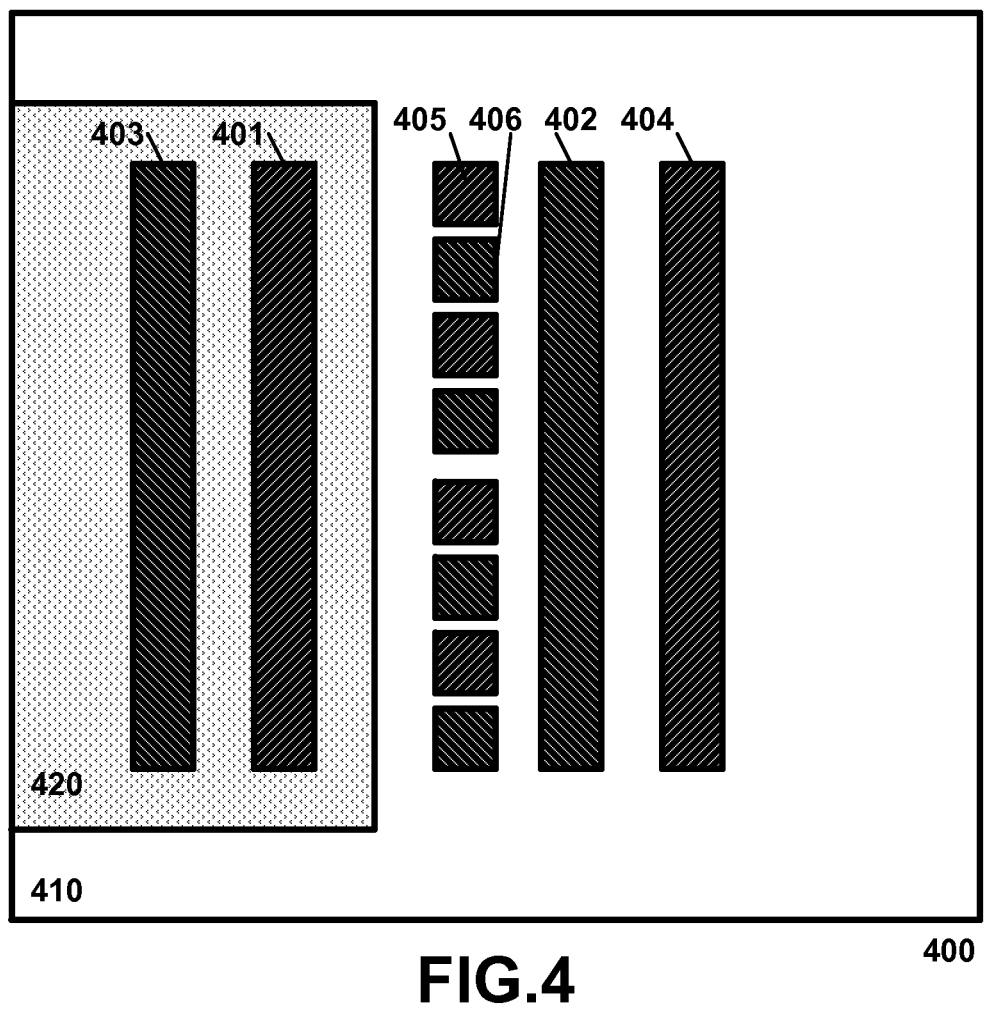
FIG. 4 shows a top view of a third embodiment of a HV ESD protection circuit comprising an alternate layout for SCR compensation regions.

FIG. 4 shows a top view of an embodiment of a HV ESD protection circuit 400 wherein compensation regions 405 and 406 may be implemented in an interleaved fashion rather than in parallel as shown in alternate embodiments. The interleaved layout shown may increase the area efficiency by optimizing the layout of compensation regions 405 and 406. Regions 405 and 406 may also be connected by connector elements in a variety of ways to suit a particular desired performance and achieve a desired voltage relationship between the regions.

Figure 5:
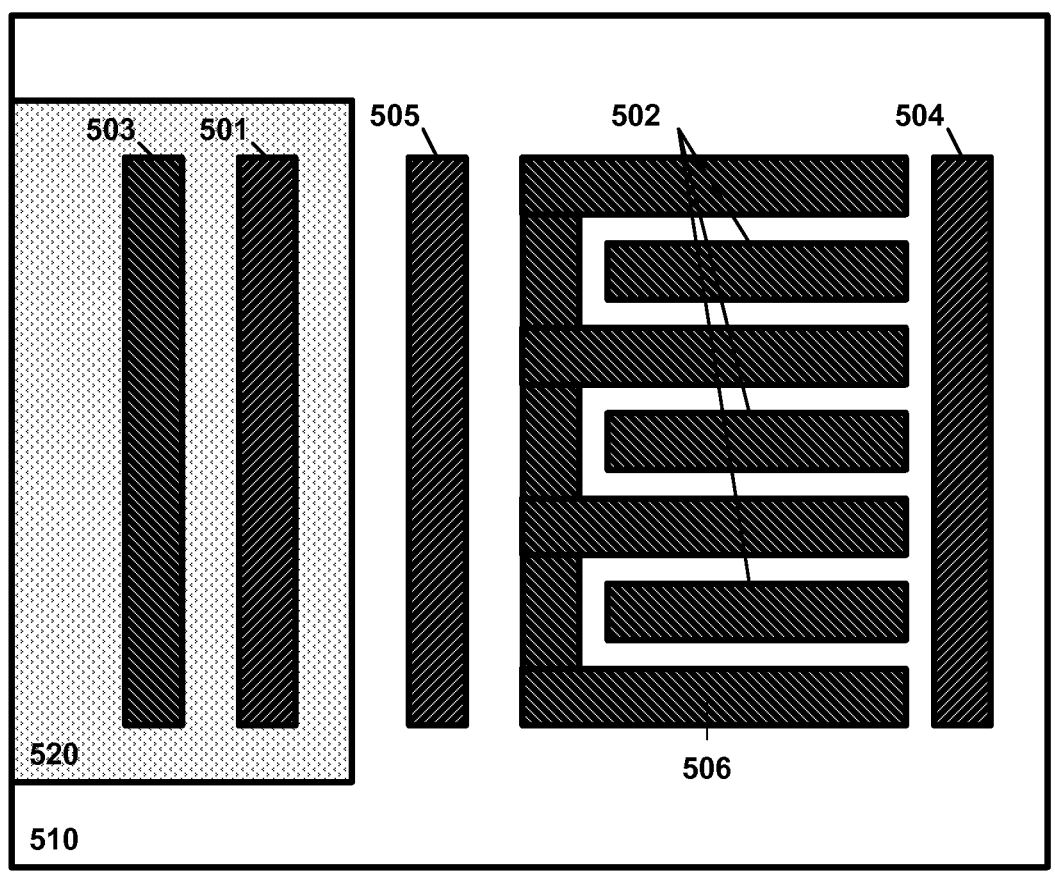
FIG. 5 shows a top view of a fourth embodiment of a HV ESD protection circuit comprising an alternate layout of an SCR cathode and compensation regions.

FIG. 5 shows a top view of an embodiment of a HV ESD protection circuit 500 wherein region 502 may be segmented and compensation region 506 may be extended into spaces between the segments of 502. The layout of regions 502 and 506 may increase the effectiveness of bipolar transistor 583 relative to bipolar transistor 582 which may result in a higher holding voltage. Though regions 502 and 506 may be segmented and oriented in the layout shown in FIG. 5, one should recognize alternate layouts are possible which may be preferable for a specific desired behavior of the SCR device.

Figure 6:
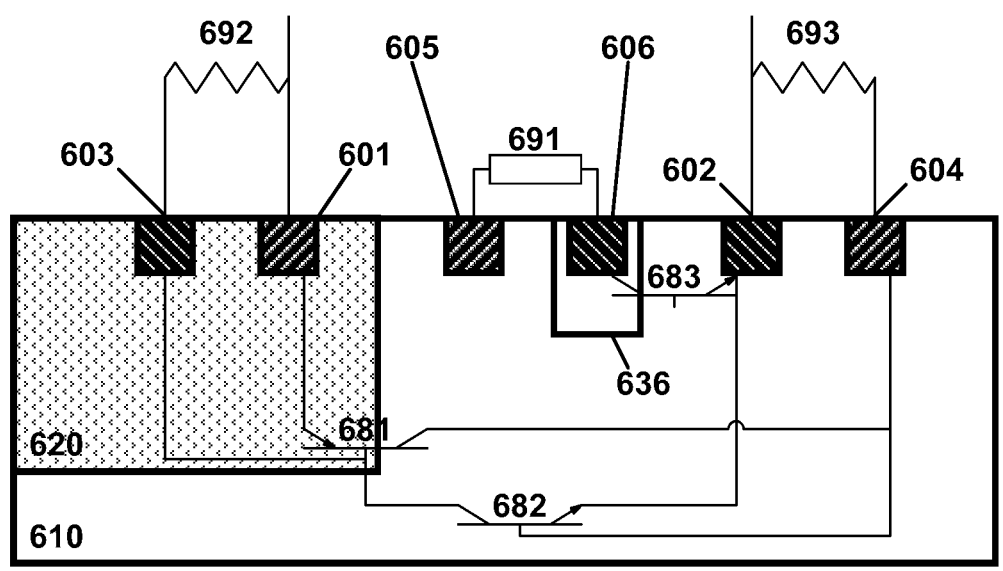
FIG. 6 shows a fifth embodiment of a HV ESD protection circuit comprising a low doped region extending a compensation region.

FIG. 6 shows an embodiment of a HV ESD protection circuit 600 wherein region 606 may be surrounded by a well region 636. Region 636 may be of the same conductivity as region 606 with a lower doping concentration than region 606. In one embodiment, region 636 at least touches region 606, and in another embodiment region 636 completely surrounds region 606. As shown in FIG. 6, region 636 may extend compensation region 606 further into the current path between anode 601 and cathode 602. Region 636 may also increase the effectiveness of bipolar 683 by increasing the junction area of its collector 606. In one embodiment, region 636 may be a lowly doped region that may extend deeper into region 610 than region 606. In another embodiment, region 636 may be the same well type as region 620. In yet another embodiment, region 636 may be any well region that extends deeper into region 610 than region 606 and has the same conductivity as region 606. It should be understood that a well region of similar type to well region 636 may be added to or removed from any of the embodiments described herein.

Figure 7:
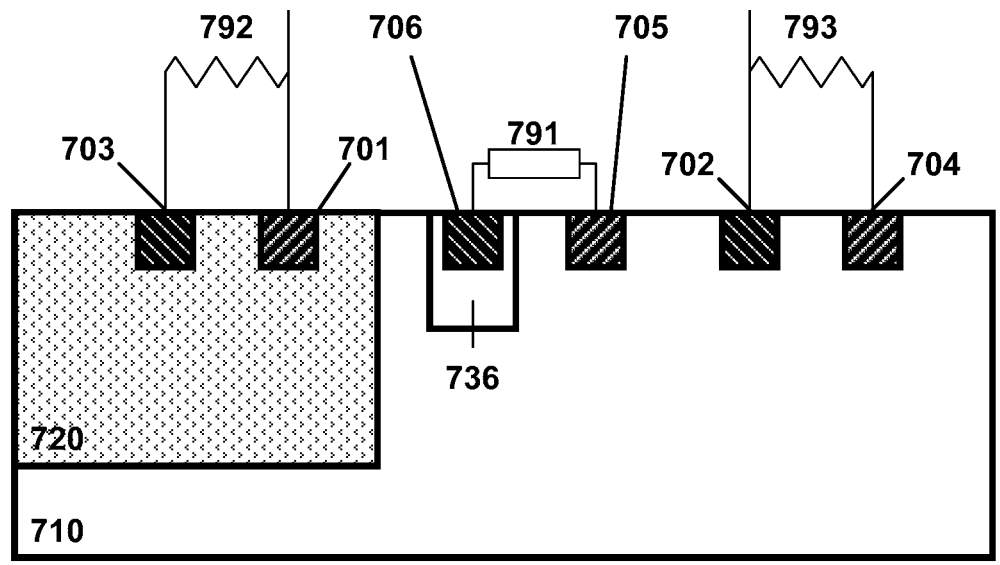
FIG. 7 shows a sixth embodiment of a HV ESD protection circuit comprising an alternate layout of compensation regions including a low doped region.

FIG. 7 shows an embodiment of a HV ESD protection circuit 700 similar to the embodiment shown in FIG. 6, wherein the positions of compensation regions 705 and 706 are swapped such that region 706 is closer to anode 701 and region 705 is closer to cathode 702. Region 736 is similar to region 636 of FIG. 6 and is of the same conductivity type as region 706. Region 736 may extend region 706 deeper into region 710.

Figure 8:
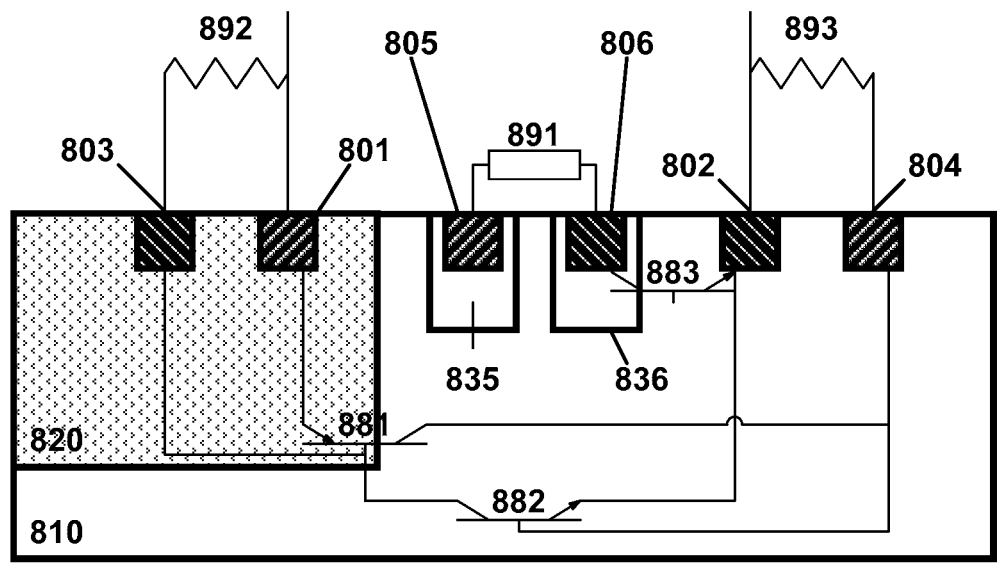
FIG. 8 shows a seventh embodiment of a HV ESD protection circuit comprising a low doped region of a first conductivity extending a first compensation region of the first conductivity and a second low doped region of a second conductivity extending a second compensation region of the second conductivity.

FIG. 8 shows an embodiment of a HV ESD protection circuit 800 similar to the embodiment shown in FIG. 6, wherein HV ESD protection circuit 800 further includes region 835. Region 835 may be of the same conductivity type as region 805. In one embodiment, region 835 at least touches region 805, and in another embodiment region 835 completely surrounds region 805. As shown in FIG. 8, region 835 may extend region 805 further into the current path between anode 801 and cathode 802. In one embodiment, region 835 may be a lowly doped region that may extend deeper into region 810 than region 805. Region 805 may have a low voltage and region 835 may extend the low voltage further into region 810 which may cause a larger amount of current to be diverted through bipolar 883 instead of bipolar 882.

Figure 9:
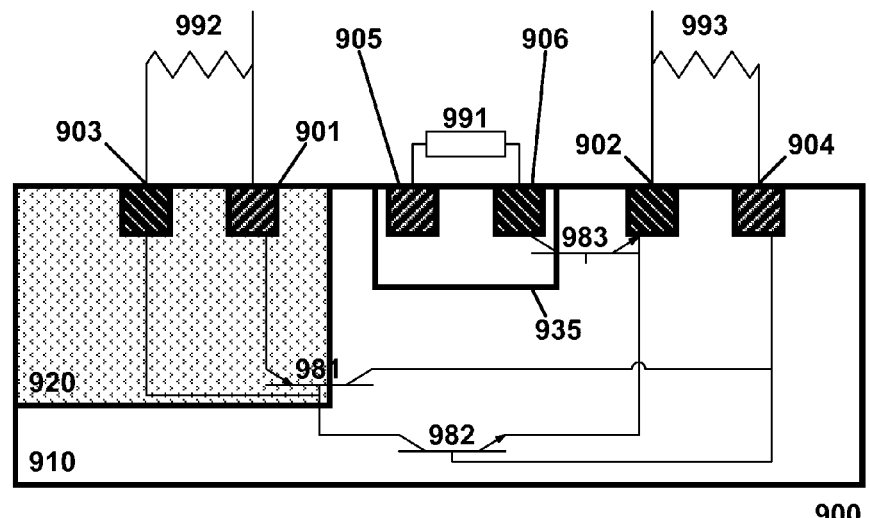
FIG. 9 shows an eighth embodiment of a HV ESD protection circuit comprising a low doped region extending under both compensation regions.

FIG. 9 shows an embodiment of a HV ESD protection circuit 900 similar to the embodiment shown in FIG. 8, wherein region 935 may be extended under both regions 905 and 906. Region 935 may be of the same conductivity type as region 905. In this embodiment, a low doped region similar to region 836 of FIG. 8 may not be formed.

Figure 10:
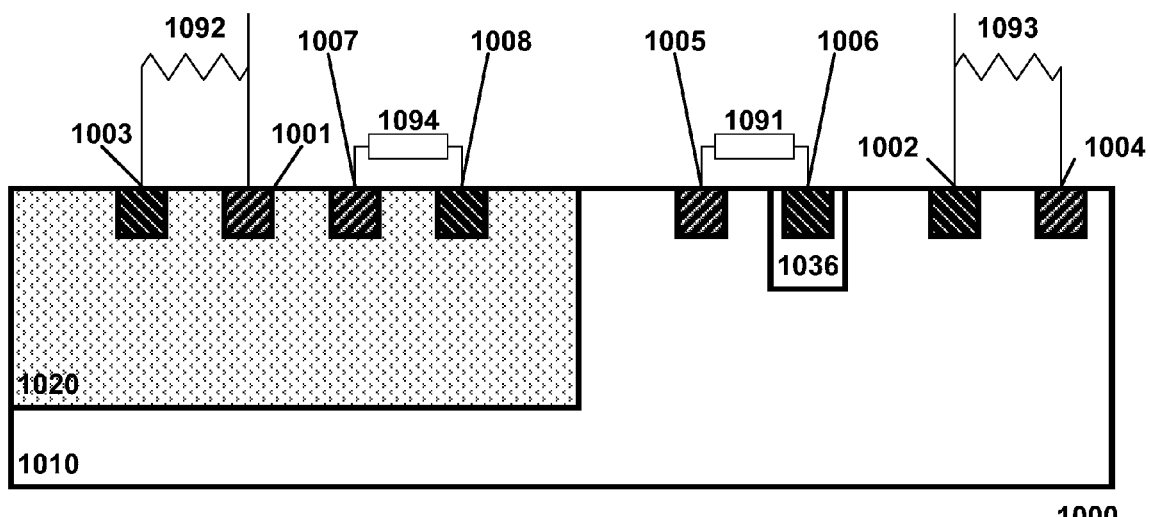
FIG. 10 shows a ninth embodiment of a HV ESD protection circuit comprising compensation regions with in a first well region of a first conductivity type and compensation regions within a second well region of a second conductivity type.

FIG. 10 shows an embodiment of a HV ESD protection circuit 1000 incorporating features similar to the embodiments shown in FIG. 3 and FIG. 6, wherein the HV ESD protection circuit 1000 may include both compensation regions 1005 and 1006 and compensation regions 1007 and 1008. Regions 1005, 1006, and 1010 may form a first compensation bipolar, and regions 1007, 1008, and 1020 may form a second compensation bipolar. FIG. 10 depicts a region 1036 which may be of the same conductivity as region 1006 and may extend region 1006 similar to how region 636 may extend region 606 in FIG. 6. Inclusion of regions 1005, 1006, 1007, and 1008 may decrease the efficiency of the SCR device which may increase the holding voltage.

Figure 11:
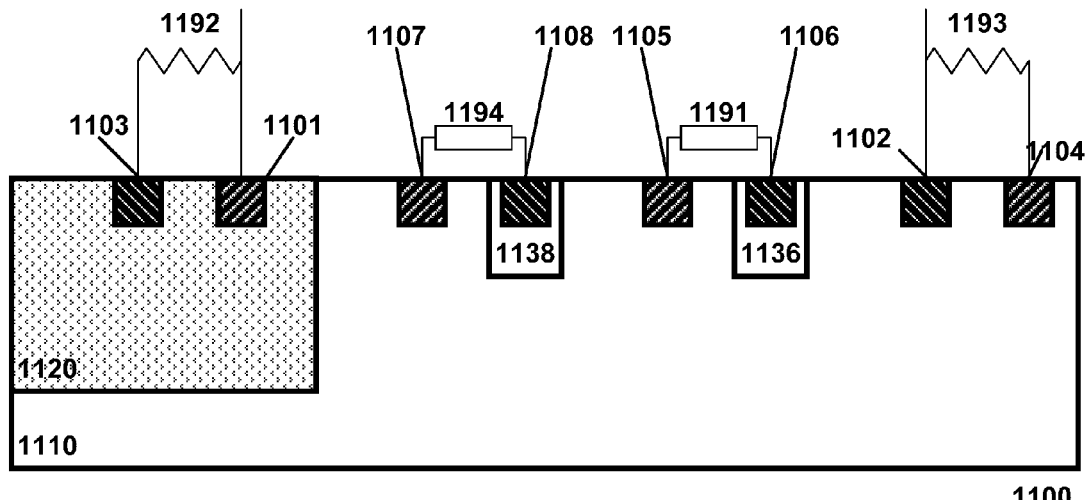
FIG. 11 shows a tenth embodiment of a HV ESD protection circuit comprising multiple pairs of compensation regions.

FIG. 11 shows an embodiment of a HV ESD protection circuit 1100 similar to the embodiment shown in FIG. 10, wherein compensation regions 1105, 1106, 1107, and 1108 may be located within region 1110. Regions 1105 and 1107 may be of a first conductivity type. Regions 1106 and 1108 may be of a second conductivity type. Regions 1136 and 1138 may be of the second conductivity type and extend regions 1106 and 1108 respectively. While the embodiment shown in FIG. 11 depicts 2 coupled pairs of compensation regions, any number of coupled pairs of compensation regions may be placed within the LAC of the SCR device. Adding coupled pairs may increase the holding voltage of the SCR device while increasing the area consumption of the SCR device.

Figure 12:
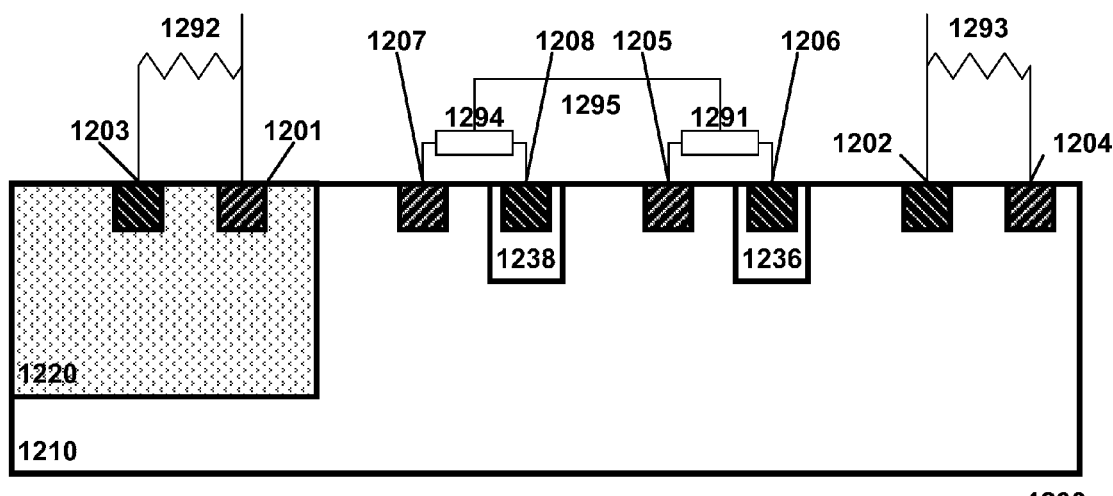
FIG. 12 shows an eleventh embodiment of a HV ESD protection circuit comprising multiple pairs of compensation regions connected in a first configuration.
Figure 13:
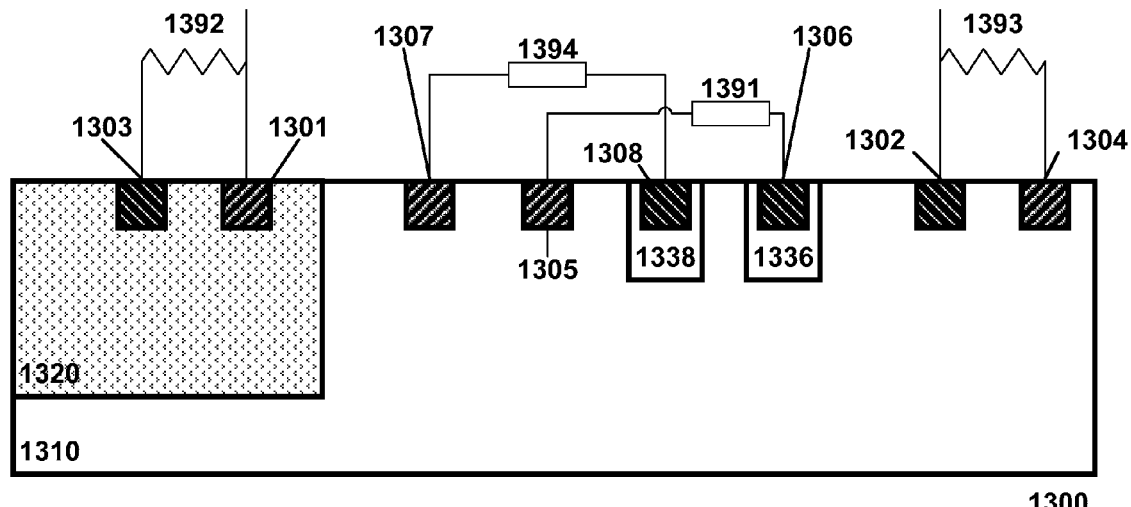
FIG. 13 shows a twelfth embodiment of a HV ESD protection circuit comprising multiple pairs of compensation regions connected in a second configuration.
Figure 14:
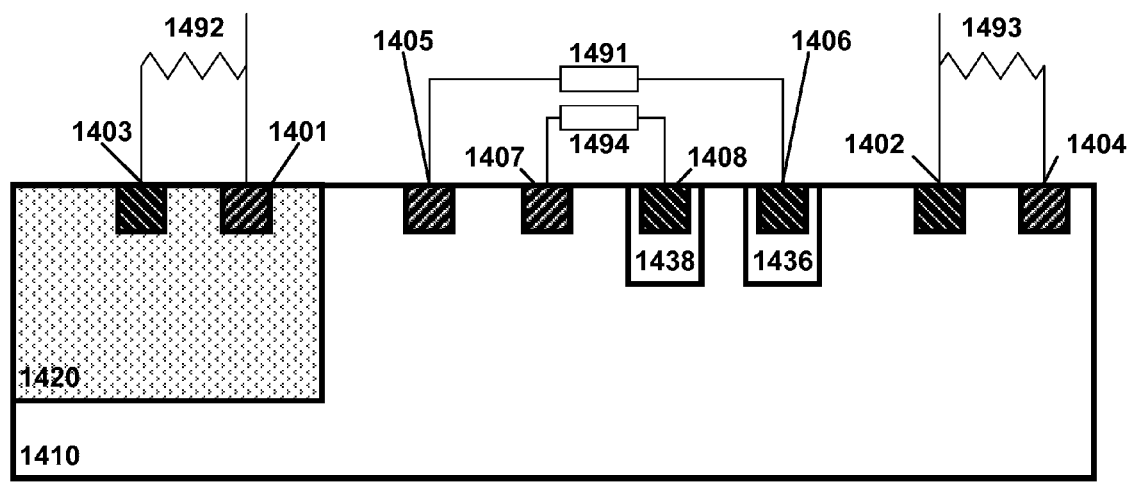
FIG. 14 shows a thirteenth embodiment of a HV ESD protection circuit comprising multiple pairs of compensation regions connected in a third configuration.

FIGS. 12-14 show embodiments of a HV ESD protection circuit comprising several possible permutations of multiple coupled pairs of compensation regions. One should recognize the coupled pairs arrangements shown in FIGS. 12-14 are only three of many possible permutations of connections and placements of the coupled pairs. The following three examples are not meant to be an exhaustive list of the potential arrangements and placements of the coupled pair regions.

FIG. 12 shows an embodiment of a HV ESD protection circuit 1200 comprising compensation regions 1205 and 1206 which may be adjacent to each other and may be coupled by connection element 1291. Compensation regions 1207 and 1208 may be adjacent to each other and may be coupled by connection element 1294. The coupled pairs may be coupled to each other through connection element 1295.

FIG. 13 shows an embodiment of a HV ESD protection circuit 1300 comprising compensation regions 1305 and 1306 which may be coupled by connection element 1391, and compensation regions 1307 and 1308 which may be coupled by connection element 1394. In the embodiment shown in FIG. 13, the regions may be placed such that region 1305 is between the coupled pair 1307 and 1308, and region 1308 is between the coupled pair 1305 and 1306.

FIG. 14 shows an embodiment of a HV ESD protection circuit 1400 comprising compensation regions 1405 and 1406 which may be coupled by connection element 1491, and compensation regions 1407 and 1408 which may be coupled by connection element 1494. In the embodiment shown in FIG. 14, regions 1407 and 1408 may be placed between regions 1405 and 1406.

Figure 15:
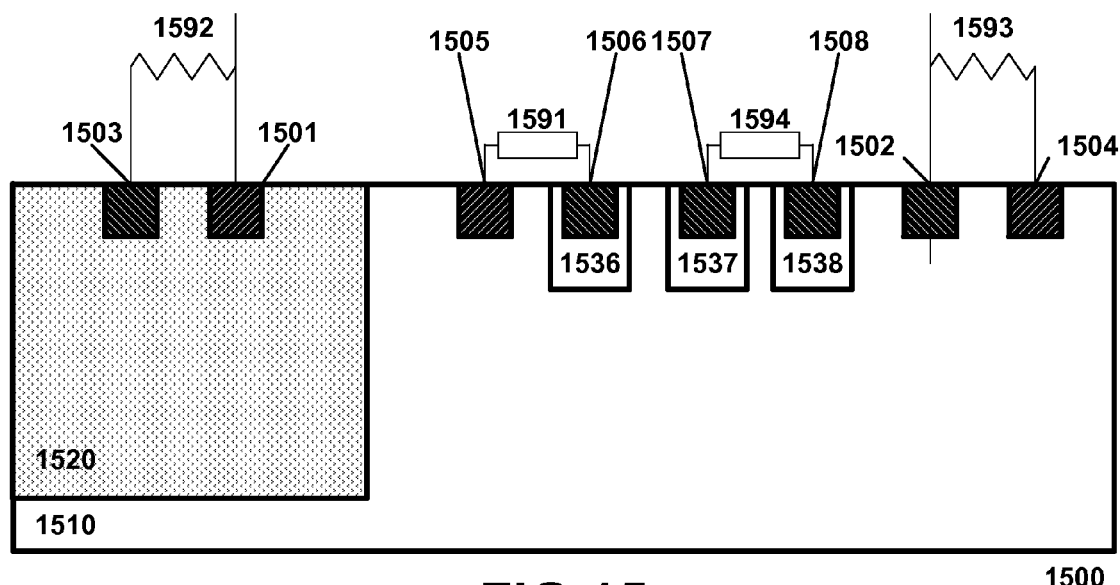
FIG. 15 shows a fourteenth embodiment of a HV ESD protection circuit comprising additional compensation regions to boost negative feedback.

FIG. 15 shows an embodiment of a HV ESD protection circuit 1500 wherein regions 1507 and 1508 may be of the same conductivity type as region 1506 and may be placed between region 1506 and region 1502. Regions 1507 and 1508 may be coupled by connection element 1594. In this embodiment, an additional bipolar transistor may be formed by regions 1502, 1508, and 1510. Region 1507 may be viewed as the emitter of bipolar 1583, where in previously described embodiments the emitter of bipolar 1583 was similarly constituted by region 1502. The additional bipolar transistor may draw additional highly energetic minority carriers away from region 1510. The highly energetic minority carriers collected at region 1508 may be reduced to lower energy minority carriers as they are injected by region 1507 at a higher voltage. The lower energy carriers may be more easily collected by region 1506 due to reduced momentum which may increase the effectiveness of bipolar 1583. The effectiveness of 1582 may be decreased due to a longer base length resulting from the extra regions 1507 and 1508 within the LAC. Though FIG. 15 depicts one pair of coupled regions 1507 and 1508, any number of pairs of similar coupled regions may be placed within the LAC.

Figure 16:
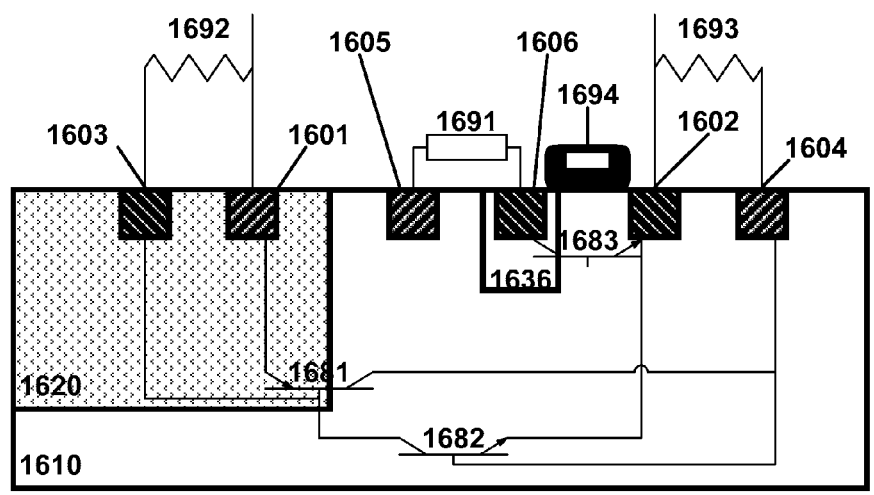
FIG. 16 shows a fifteenth embodiment of a HV ESD protection circuit comprising a gate to block surface isolation in a first location.

FIG. 16 shows an embodiment of a HV ESD protection circuit 1600 wherein a gate 1694 may be placed between compensation region 1606 and cathode 1602. The gate 1694 may block a chip surface isolation layer locally between regions 1602 and 1606 which may increase the effectiveness of bipolar 1683. Alternatively, a special layer (e.g. shallow trench isolation (STI) block) may be placed to prevent the formation of an isolation layer between regions 1602 and 1606.

Figure 17:
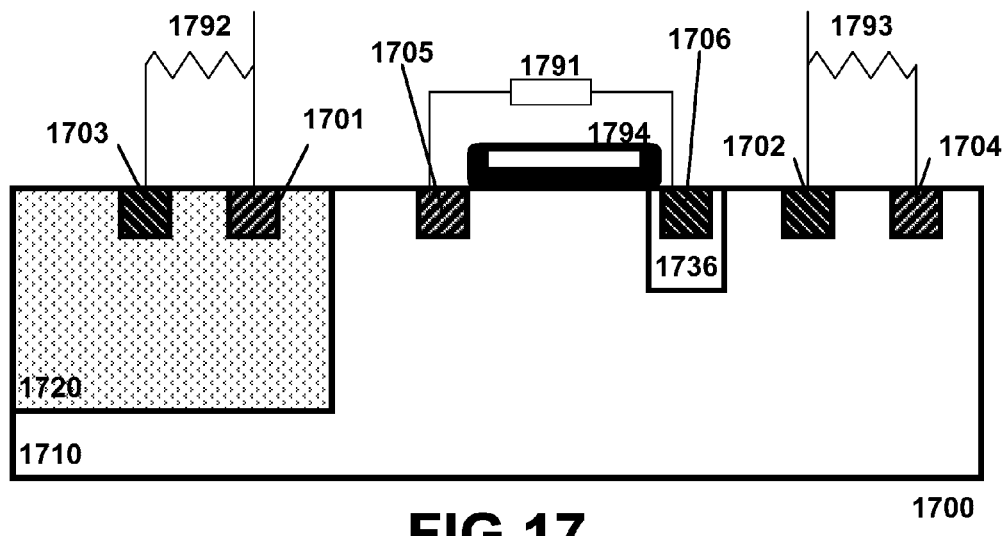
FIG. 17 shows a sixteenth embodiment of a HV ESD protection circuit comprising a gate to block surface isolation in a second location.

FIG. 17 shows an embodiment of a HV ESD protection circuit 1700 wherein a gate 1794 may be placed between compensation regions 1705 and 1706. The gate 1794 may block a chip surface isolation layer locally between regions 1705 and 1706 which may improve the connection between regions 1705 and 1706. Alternatively, a special layer (e.g. shallow trench isolation (STI) block) may be placed to prevent the formation of an isolation layer between regions 1705 and 1706.

Figure 18:
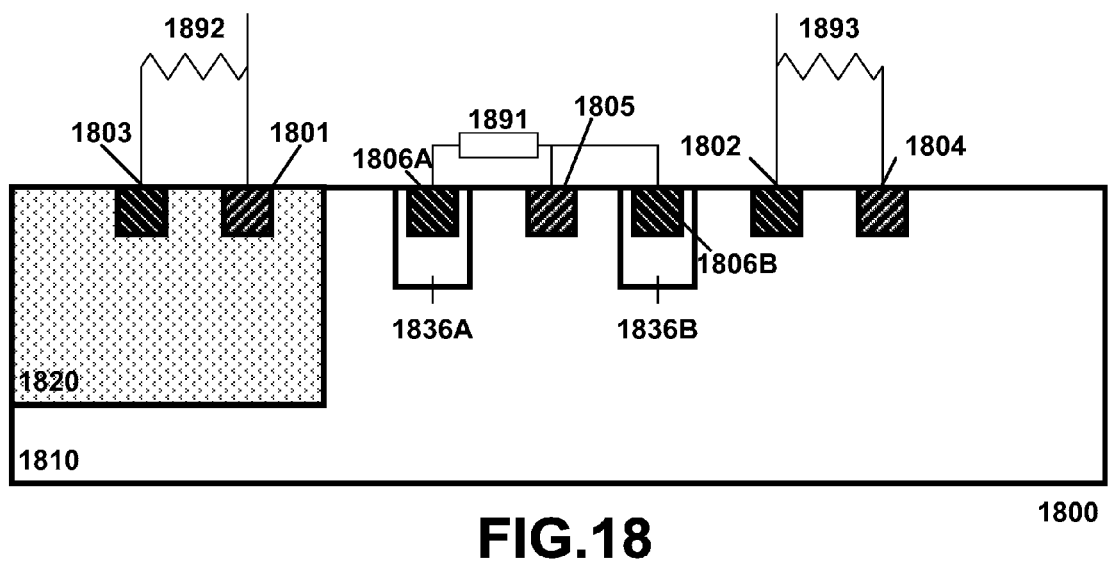
FIG. 18 shows a seventeenth embodiment of a HV ESD protection circuit comprising a first compensation region split into two regions.

FIG. 18 shows an embodiment of a HV ESD protection circuit 1800 wherein compensation region 1806 may be split into regions 1806A and 1806B. Compensation region 1805 may be placed between regions 1806A and 1806B. Regions 1805, 1806A, and 1806B may be coupled together by connection element 1891. One should recognize various other relative placements of regions 1805, 1806A, and 1806B may be possible within the LAC. One should also recognize region 1806 may be split into more than 2 regions.

Figure 19:
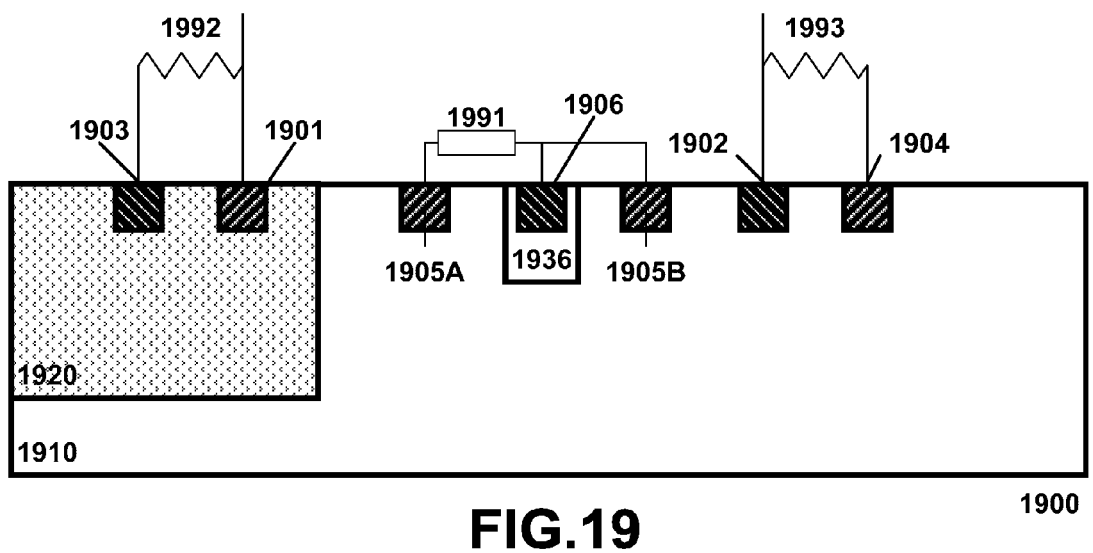
FIG. 19 shows an eighteenth embodiment of a HV ESD protection circuit comprising a second compensation region split into two regions.

FIG. 19 shows an embodiment of a HV ESD protection circuit 1900 wherein compensation region 1905 may be split into regions 1905A and 1905B. Compensation region 1906 may be placed between regions 1905A and 1905B. Regions 1905A, 1905B, and 1906 may be coupled together by connection element 1991. One should recognize various other relative placements of regions 1905A, 1905B, and 1906 may be possible within the LAC. One should also recognize region 1905 may be split into more than 2 regions.

Figure 20:
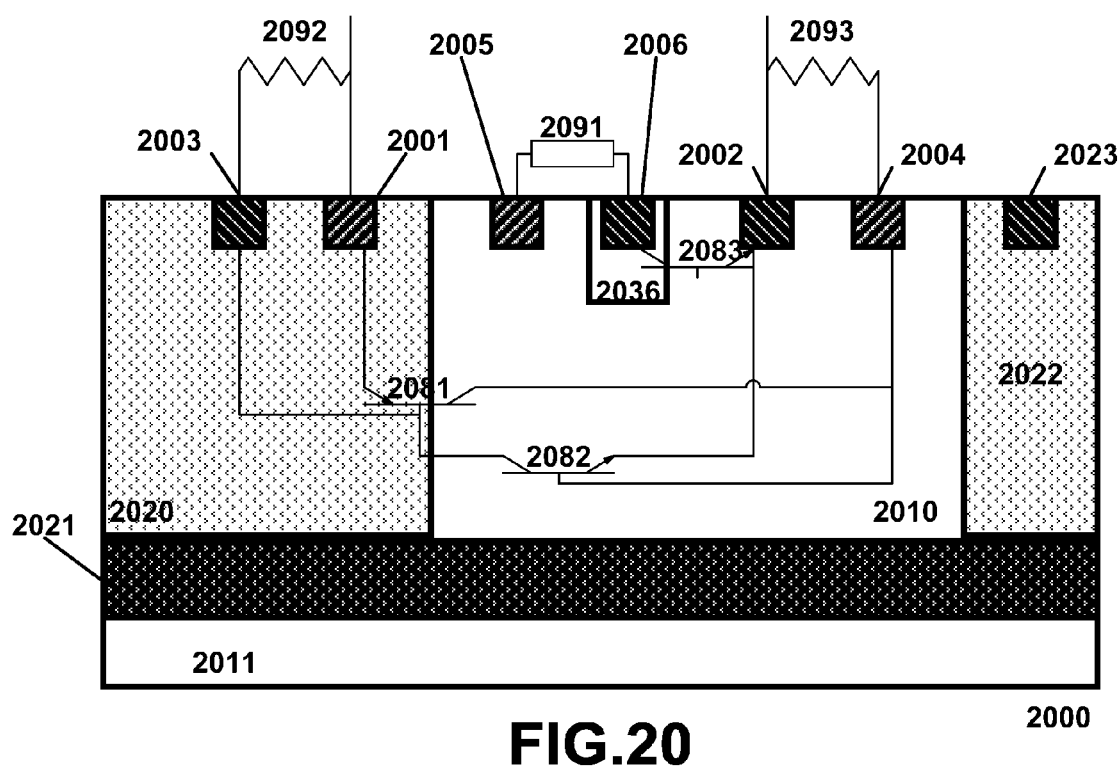
FIG. 20 shows a nineteenth embodiment of a HV ESD protection circuit comprising a first implementation of a deep well/buried layer structure.

FIG. 20 shows an embodiment of a HV ESD protection circuit 2000 wherein a deep or buried layer 2021 may be added to isolate well region 2010. Region 2010 may be isolated to separate it from other devices in the chip or for processing issues. Region 2010 may be of a first conductivity type and regions 2003, 2020, 2021, 2022, and 2023 may be of a second conductivity type. Buried layer 2021 may resistively couple region 2003 to region 2023. Regions 2003 and 2023 may be safely connected to the same node without any significant interference in the operation of the SCR device.

Figure 21:
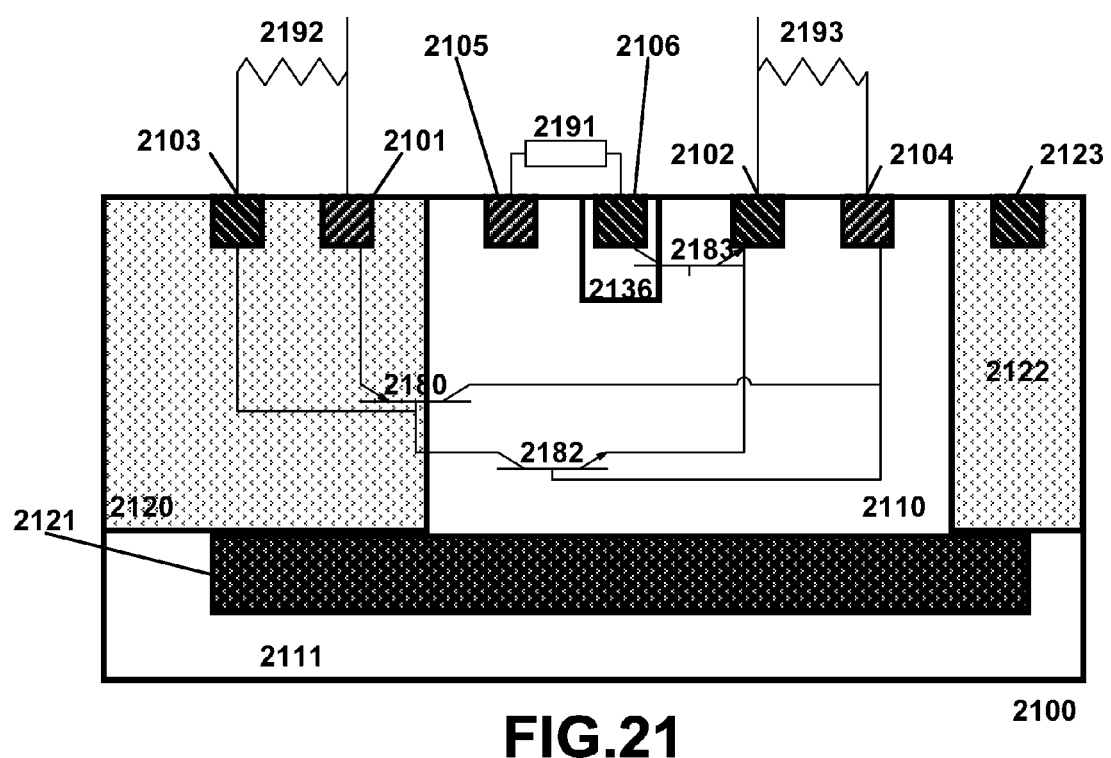
FIG. 21 shows a twentieth embodiment of a HV ESD protection circuit comprising a second implementation of a deep well/buried layer structure.

FIG. 21 shows an embodiment of a HV ESD protection circuit 2100 similar to the embodiment shown in FIG. 20, wherein deep well region 2121 may not extend entirely underneath well region 2120 or 2122.

Figure 22:
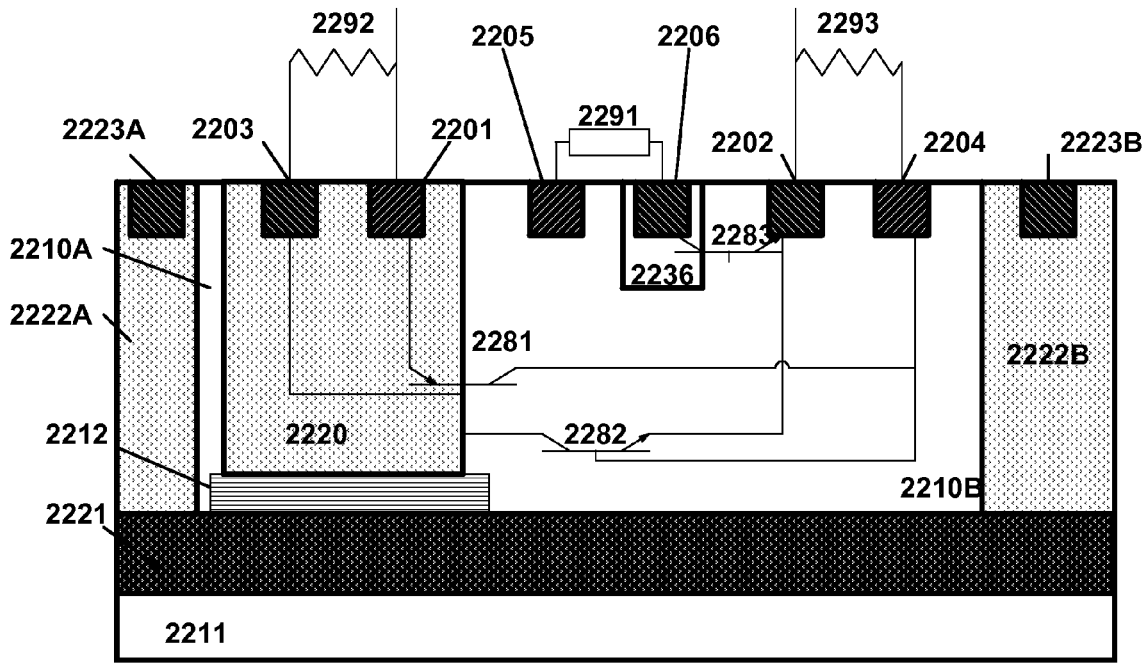
FIG. 22 shows a twenty-first embodiment of a HV ESD protection circuit comprising an isolating region separating a well from a deep well/buried layer structure.

FIG. 22 shows an embodiment of a HV ESD protection circuit 2200 similar to the embodiments shown in FIGS. 20 and 21, wherein an additional region 2212 may be added to separate well region 2220 from buried layer 2221. Regions 2210A, 2210B, and 2212 may be of a first conductivity type and regions 2220, 2221, 2222A, and 2222B may be of a second conductivity type. In this embodiment, region 2201 may be isolated from regions 2223A and 2223B. Region 2220 may also be isolated from regions 2221, 2222A, and 2222B by regions 2210A, 2210B, and 2212. Regions 2222A and 2222B may be formed by a single well of the second conductivity type. Regions 2223A and 2223B may be formed by a single ring region of the second conductivity type. Regions 2210A and 2210B may be formed by a single well of the first conductivity type.

Figure 23:
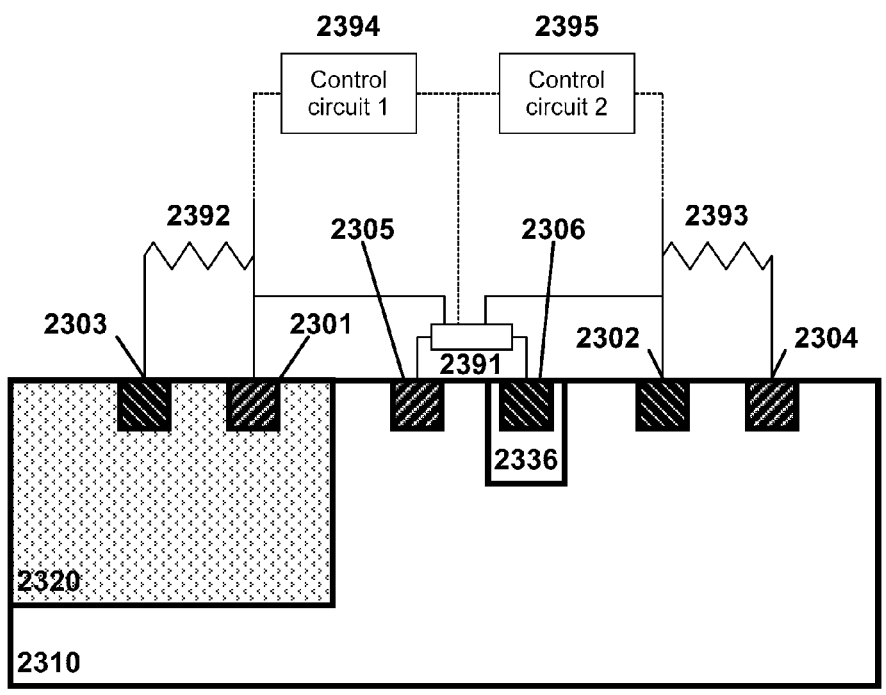
FIG. 23 shows a twenty-second embodiment of a HV ESD protection circuit comprising control circuits to influence the operation of compensation regions.

FIG. 23 shows an embodiment of a HV ESD protection circuit 2300 wherein control circuits 2394 and/or 2395 may be coupled to compensation regions 2305 and 2306. The control circuits may be any of a resistor, capacitor, diode, MOS device, bipolar, or any combination of these elements or any other electrical elements which may be used to alter the behavior of bipolar 2383 formed in part by compensation region 2306. The control circuits may alter the resistance of the collector of bipolar 2383 which may affect the operation of bipolar 2383 which, in turn, may impact the feedback of the SCR device.

By changing the feedback of the SCR device, the holding voltage may be adjusted. During an ESD event, a low holding voltage may be desirable to prevent damage to the chip and to reduce power dissipation. Additional circuitry such as control circuits 2394 and 2395 may alter the holding voltage of the SCR device after the SCR device has been triggered by an ESD event. In one embodiment, the control circuits may act as a switch to decouple regions 2305 and 2306 during a first ESD period, in which the highest ESD energy may be dissipated. A typical duration of the first ESD period may be between 30 ns-100 ns. By decoupling compensation regions 2305 and 2306, the HV ESD protection circuit 2300 may exhibit a low holding voltage. After the first ESD period, the switch may short together regions 2305 and 2306 which may increase the negative feedback introduced by compensation regions 2305 and 2306. Increasing the negative feedback may increase the holding voltage which may avoid latch up during normal chip operation. Though this embodiment has been described for a single compensation region pair 2305 and 2306, one should recognize this technique may be applied to multiple compensation regions introducing multiple negative feedback effects.

Figure 24:
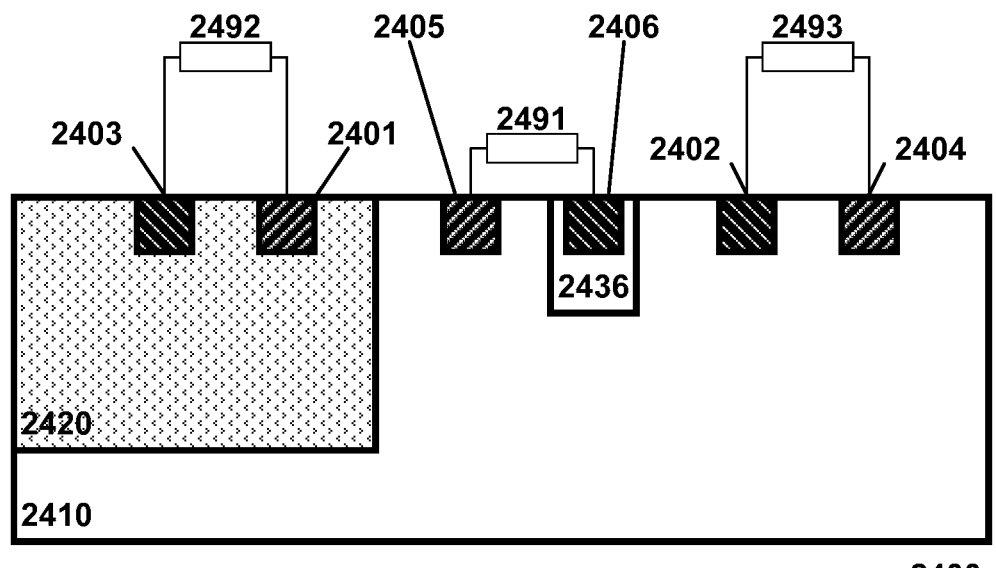
FIG. 24 shows a twenty-third embodiment of a HV ESD protection circuit comprising external circuitry to influence well regions.

FIG. 24 shows an embodiment of a HV ESD protection circuit 2400 comprising external circuits 2492 and 2493 instead of resistors as similarly shown in FIG. 6. One should recognize for any embodiment of a HV ESD protection circuit, including any described herein, an external resistance such as resistors 192 and 193 of FIG. 1 may not be necessary. By way of example, an external circuit 2492 may be coupled between regions 2401 and 2403, and an external circuit 2493 may be coupled between regions 2402 and 2404. The external circuits 2492 and 2493 may control the biasing of well regions 2420 and 2410 respectively.

Figure 25:
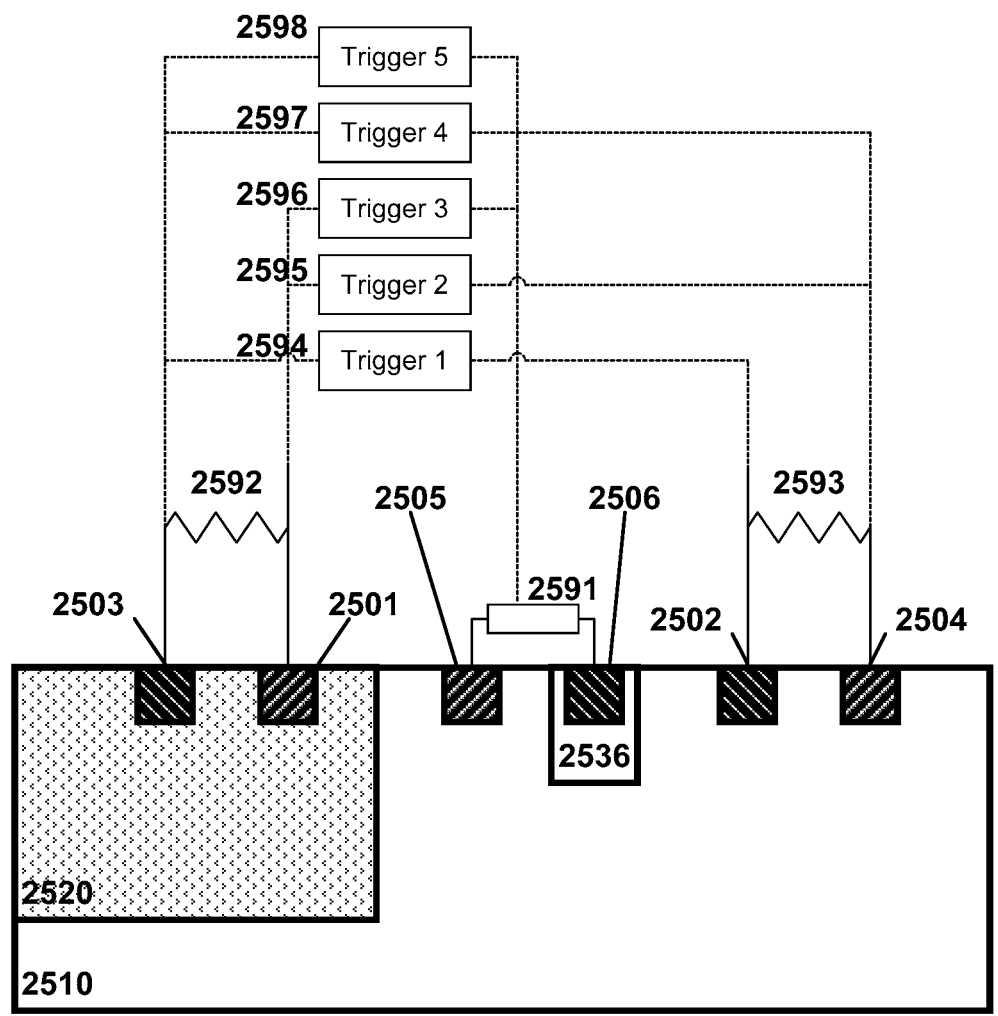
FIG. 25 shows a twenty-fourth embodiment of a HV ESD protection circuit comprising external triggers.

FIG. 25 shows an embodiment of a HV ESD protection circuit 2500 comprising external triggers 2594-2598. An external trigger may be a resistor, capacitor, diode, MOS device, bipolar, or any other electrical component or combination of components used to turn on the SCR device. Any one trigger of the triggers 2594-2498 may be present. Also, any combination of the triggers 2594-2598 may be present. As shown in FIG. 25, a trigger may be coupled to at least one of regions 2501, 2502, 2503, 2504, 2505, or 2506. During an ESD event, a trigger may inject current into a region (e.g. a base of a bipolar that makes up the SCR) which may cause junctions of the SCR to become forward biased and turn on the HV ESD protection circuit 2500.

Figure 26:
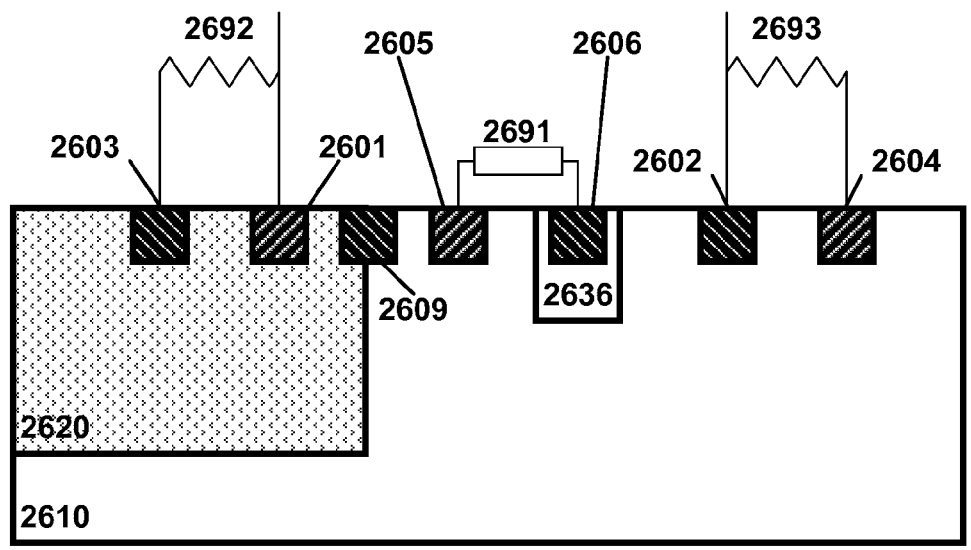
FIG. 26 shows a twenty-fifth embodiment of a HV ESD protection circuit comprising a well region to influence a reverse breakdown voltage.

FIG. 26 shows an embodiment of a HV ESD protection circuit 2600 similar to FIG. 6 and comprising region 2609 of the same conductivity type as region 2620. Alternatively, the region 2609 may be of the same conductivity type as region 2610. If a voltage in region 2620 relative to region 2610 rises to reach the reverse breakdown voltage of the junction between regions 2620 and 2610, a current may be induced and flow through regions 2603 and 2604 which may be viewed as the trigger taps of the SCR. The induced current may then trigger the SCR device to turn on. Region 2609 may lower the reverse breakdown voltage of the junction between regions 2620 and 2610. One may view region 2609 as a way to adjust the trigger voltage.

Figure 27:
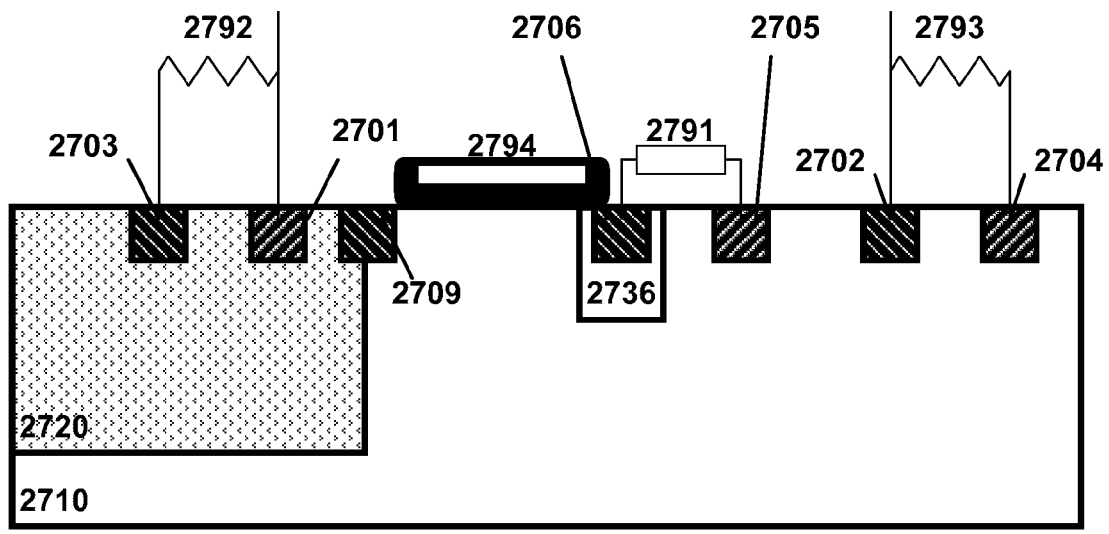
FIG. 27 shows a twenty-sixth embodiment of a HV ESD protection circuit comprising a gate region to tune a reverse breakdown voltage.

FIG. 27 shows an embodiment of a HV ESD protection circuit 2700 similar to FIG. 26 comprising a gate 2794 placed between regions 2709 and 2706. The gate 2794 may block a chip surface isolation layer locally between regions 2709 and 2706 which may tune the reverse breakdown voltage of the junction between regions 2720 and 2710. Alternatively, a special layer (e.g. shallow trench isolation (STI) block) may be placed to prevent the formation of an isolation layer between regions 2709 and 2706.

Figure 28:
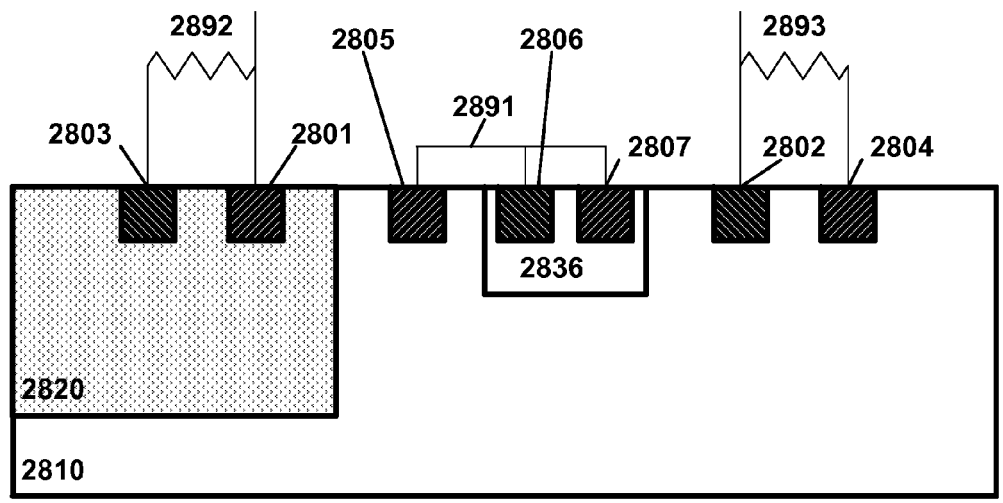
FIG. 28 shows a twenty-seventh embodiment of a HV ESD protection circuit comprising an additional SCR for compensation.

FIG. 28 shows an embodiment of a HV ESD protection circuit 2800 comprising compensation regions 2805, 2806, and 2807 in the LAC of the SCR device. Regions 2805, 2807, and 2810 may be of a first conductivity type and regions 2806 and 2802 may be of a second conductivity type. Region 2836 may be a low doped region of the second conductivity type and extend under regions 2806 and 2807. A first bipolar may be formed by region 2836 (collector), region 2810 (base), and region 2802 (emitter). A second bipolar may be formed by region 2807 (emitter), region 2836 (base), and region 2810 (collector). When the first bipolar conducts current, the current may be drawn from region 2806 which may cause a voltage drop in region 2836. The voltage drop may cause the junction between regions 2836 and 2807 to become forward biased. The forward biased junction may cause the second bipolar to turn on and inject current into region 2810. As such the first bipolar and the second bipolar form an additional SCR. The additional SCR decreases the effectiveness of bipolar 2882 by creating a preferred current path to cathode 2802 which may increase the holding voltage of the SCR device.

Figure 29:
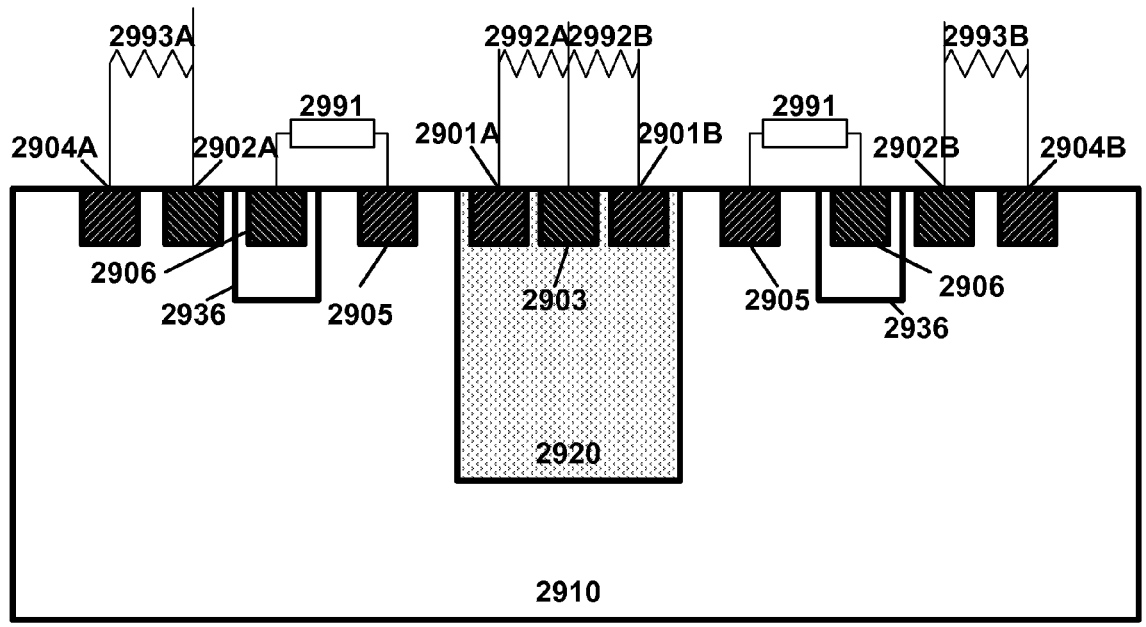
FIG. 29 shows a twenty-eighth embodiment of a HV ESD protection circuit comprising a first two-finger arrangement.

FIG. 29 shows an embodiment of a HV ESD protection circuit 2900 comprising a multi-finger structure. In the embodiment shown in FIG. 29, the left half and right half each constitutes one finger of a two finger structure. Region 2903 may be a trigger tap common to both the left half "A" finger and the right half "B" finger. Region 2920 may be a lower doped region of the same conductivity type as region 2903 common to both fingers. Though FIG. 29 shows an embodiment with two fingers, one should recognize a structure is possible with any number of fingers.

Figure 30:
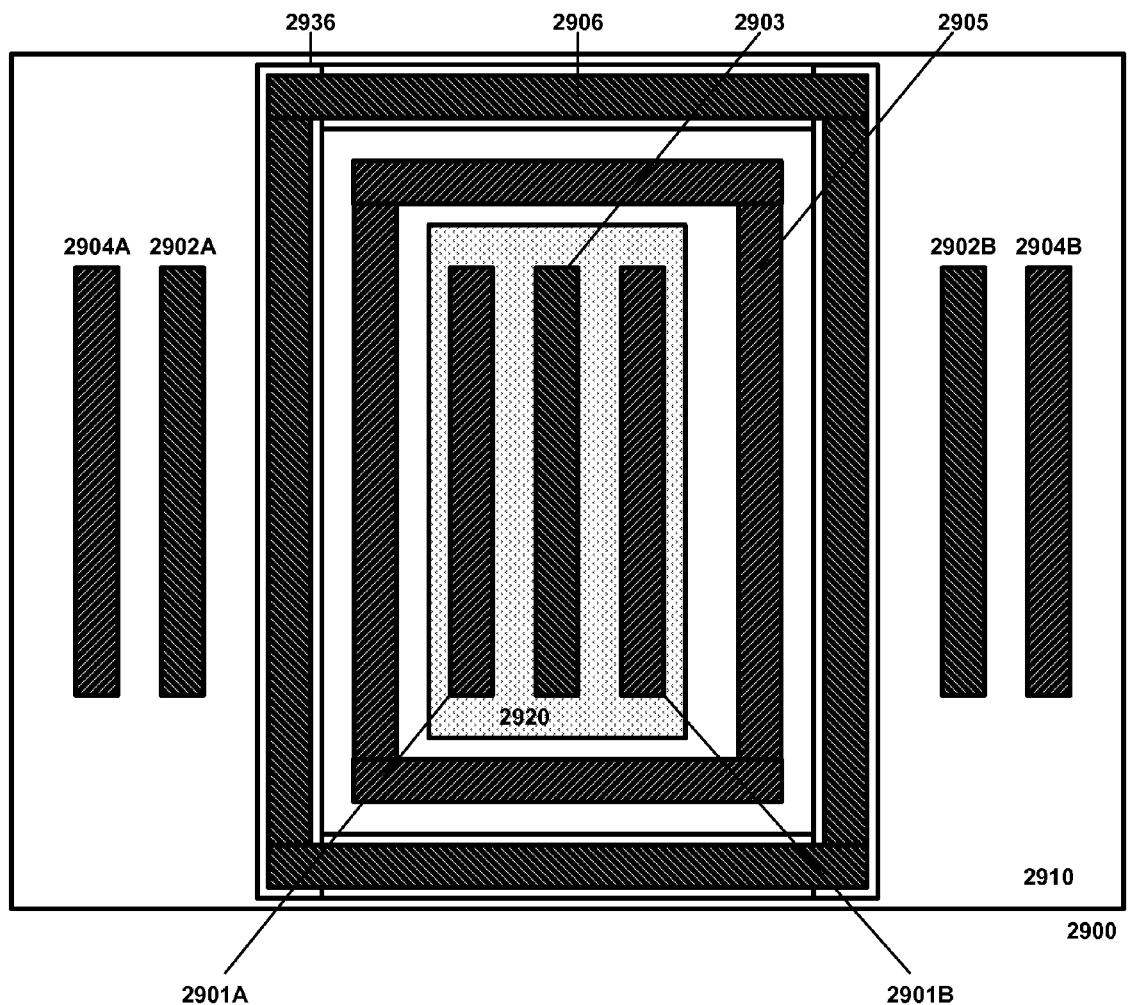
FIG. 30 shows a top view of the twenty-eighth embodiment of the HV ESD protection circuit shown in FIG. 29.

FIG. 30 shows a top-view of the embodiment of the HV ESD protection circuit 2900 shown in FIG. 29. Compensation regions 2905 shown in FIG. 29 may be implemented as a single ring region 2905 around region 2920. Compensation regions 2906 shown in FIG. 29 may be implemented as a single ring region 2906 around region 2905. Lower doped regions 2936 extending regions 2906 in FIG. 29 may be implemented as region 2936 by surrounding ring region 2906 shown in FIG. 30.

Figure 31:
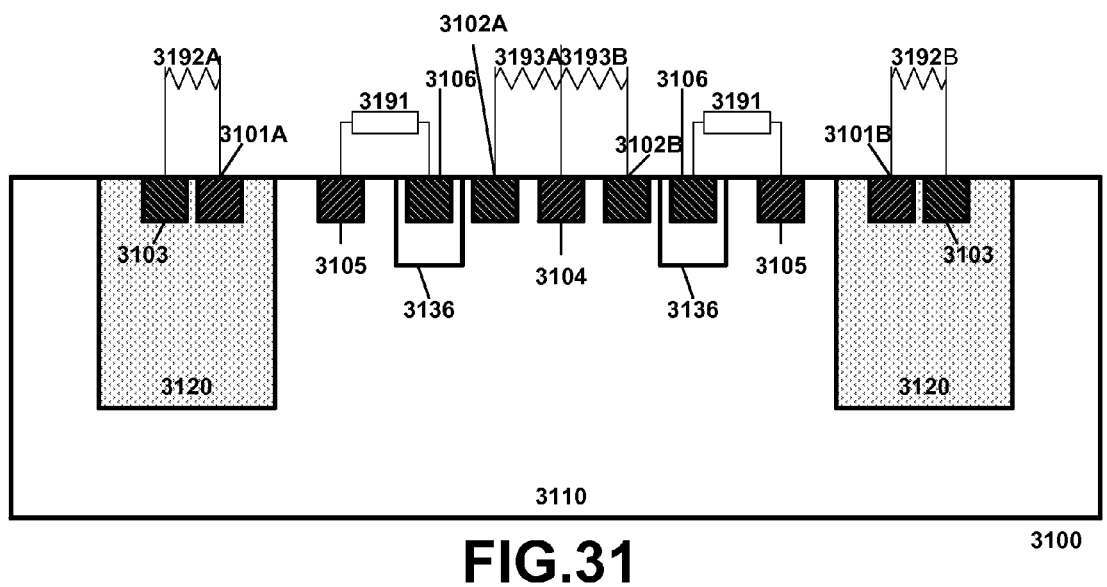
FIG. 31 shows a twenty-ninth embodiment of a HV ESD protection circuit comprising a second two-finger arrangement.

FIG. 31 shows an embodiment of a HV ESD protection circuit 3100 comprising a multi-finger structure. In the embodiment shown in FIG. 31, the left half and right half each constitutes one finger of a two finger structure. Region 3104 may be a trigger tap common to both the left half "A" finger and the right half "B" finger. Though FIG. 31 shows an embodiment with two fingers, one should recognize a structure is possible with any number of fingers. One should recognize that FIG. 31 differs from FIG. 29 in that the embodiment shown in FIG. 31 may have a central well of a first conductivity type, while the embodiment shown in FIG. 29 may have a central well of a second conductivity type.

Figure 32:
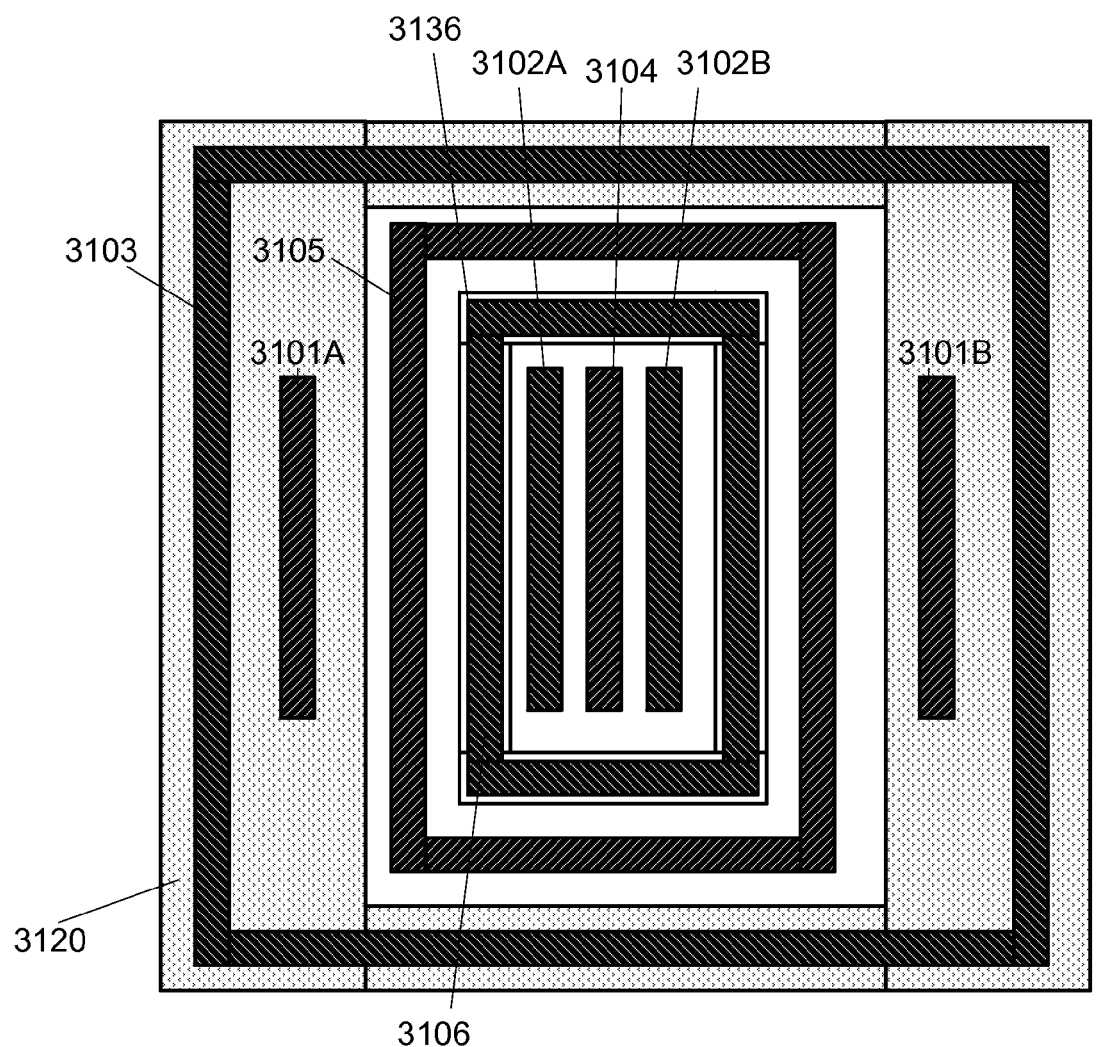
FIG. 32 shows a top view of the twenty-ninth embodiment of the HV ESD protection circuit shown in FIG. 31.

FIG. 32 shows a top-view of the embodiment of the HV ESD protection circuit 3100 shown in FIG. 31. Compensation regions 3106 shown in FIG. 31 may be implemented as a single ring region 3106 around regions 3102A, 3102B, and 3104. Compensation regions 3105 shown in FIG. 31 may be implemented as a single ring region 3105 around region 3106. Lower doped regions 3136 extending regions 3106 in FIG. 31 may be implemented as region 3136 by surrounding ring region 3106 shown in FIG. 32. Regions 3103 shown in FIG. 31 may be implemented as a single ring region 3103. Regions 3120 shown in FIG. 31 may be implemented as a single ring region 3120.

Though particular dimensions are shown for the regions and spacings throughout FIGS. 1-32, one should recognize regions and spacings of other dimensions are possible. Though the figures often depict HV ESD protection circuits in a single-finger layout, one should recognize embodiments shown in the figures may also be implemented as multi-finger layouts.

What is claimed is:

1. An electrostatic discharge (ESD) protection circuit comprising:
    a first lowly-doped well of a first conductivity type;
    a second lowly-doped well of a second conductivity type;
    a first highly-doped region of the first conductivity type formed within the first lowly-doped well;
    a second highly-doped region of the second conductivity type formed within the first lowly-doped well;
    a third highly-doped region of the first conductivity type formed within the second lowly-doped well, wherein the second highly-doped region functions as either a cathode or an anode of the ESD protection circuit and the third highly-doped region functions as the other of the anode or the cathode;
    a fourth highly-doped region of the second conductivity type formed within the second lowly-doped well;

a fifth highly-doped region of the first conductivity type formed within the first lowly-doped well between the second highly-doped region and the second lowly-doped well;

a sixth highly-doped region of the second conductivity type formed within the first lowly-doped well between the second highly-doped region and the second lowly-doped well; a first external resistive element electrically coupled between the first highly-doped region and the second highly-doped region; a second external resistive element electrically coupled between the third highly-doped region and the fourth highly-doped region; and a trigger circuit to turn on the ESD protection circuit during an ESD event, wherein the trigger circuit is electrically coupled between any two of: the first highly-doped region, the second highly-doped region, the third highly-doped region, the fourth highly-doped region, the fifth highly-doped region, and the sixth highly-doped region;

wherein a first transistor is formed by an emitter including the third highly-doped region, a base including the second lowly-doped region, and a collector including the first lowly-doped region;

a second transistor is formed by an emitter including the second highly-doped region, a base including the first lowly-doped region, and a collector including the second lowly-doped region; and a third transistor is formed by an emitter including the second highly-doped region, a base including the first lowly-doped region, and a collector including the sixth highly-doped region.

2. The ESD protection circuit of claim 1, wherein the first external resistive element comprises a first external resistor and the second external resistive element comprises a second external resistor.

3. The ESD protection circuit of claim 1, wherein:
the fifth highly-doped region is directly electrically connected to the sixth highly-doped region and no other highly-doped region is directly electrically connected to the fifth highly-doped region nor the sixth highly-doped region.

4. The ESD protection circuit of claim 1, wherein the trigger circuit comprises at least one of:
a first trigger circuit electrically coupled between the fourth highly-doped region and the second highly-doped region;
a second trigger circuit electrically coupled between the third highly-doped region and the first highly-doped region;
a third trigger circuit, wherein the fifth highly-doped region is electrically connected to the sixth highly-doped region and the third trigger circuit is electrically coupled between the third highly-doped region and the fifth highly-doped region;
a fourth trigger circuit electrically coupled between the fourth highly-doped region and the first highly-doped region; and
a fifth trigger circuit, wherein the fifth highly-doped region is electrically connected to the sixth highly-doped region and the fifth trigger circuit is electrically coupled between the fourth highly-doped region and the fifth highly-doped region;
wherein any of the first, second, third, fourth, and fifth trigger circuits is configured to turn on the ESD protection circuit during an ESD event.

5. The ESD protection circuit of claim 1 wherein:
the sixth highly-doped region is formed between the second highly-doped region and the fifth highly-doped region.

6. The ESD protection circuit of claim 1 wherein:
no highly-doped region is formed between the fifth highly-doped region and the second lowly-doped region;
no highly-doped region is formed between the fifth highly-doped region and the sixth highly-doped region; and
no highly-doped region is formed between the sixth highly-doped region and the second highly-doped region.

7. The ESD protection circuit of claim 1 wherein:
the fifth highly-doped region is electrically coupled to the sixth highly-doped region by a connection element;
wherein the connection element comprises at least one of a metal connection, a metal contact, a via, a metal line, a resistor, a capacitor, a diode, a metal oxide semiconductor (MOS) device, a bipolar transistor, and a control circuit.

8. The ESD protection circuit of claim 7, wherein:
the connection element is configured to decouple the fifth highly-doped region from the sixth highly-doped region during a normal operation of a semiconductor device, and wherein the connection element is configured to short together the fifth highly-doped region and the sixth-highly doped region during a first period of an ESD event.

9. The ESD protection circuit of claim 8, wherein:
the connection element is configured to decouple the fifth highly-doped region from the sixth highly-doped region after the first period of the ESD event.

10. The ESD protection circuit of claim 1, further comprising:
a seventh highly-doped region of the first conductivity type formed between the sixth highly-doped region and the second highly-doped region; and
an eighth region of the second conductivity type formed within the first lowly-doped well between the second highly-doped region and the third highly-doped region, wherein the eighth region at least partially surrounds the sixth highly-doped region and the seventh highly-doped region.

11. The ESD protection circuit of claim 1, further comprising:
a seventh region of the second conductivity type at least partially surrounding the sixth highly-doped region.

12. The ESD protection circuit of claim 11, wherein:
a dopant level of the seventh region is higher than a dopant level of the second lowly-doped well and the dopant level of the seventh region is lower than a dopant level of the sixth highly-doped region.

13. The ESD protection circuit of claim 1, further comprising:
a seventh region of the first conductivity type at least partially surrounding the fifth highly-doped region.

14. The ESD protection circuit of claim 13, wherein:
a dopant level of the seventh region is higher than a dopant level of the first lowly-doped well and the dopant level of the seventh region is lower than a dopant level of the fifth highly-doped region.

15. The ESD protection circuit of claim 1, further comprising:
a third lowly-doped well of the second conductivity type surrounding the first lowly-doped well and the second lowly-doped well.

16. The ESD protection circuit of claim 1, further comprising:
   a third lowly-doped well of the second conductivity type; and
   a fourth lowly-doped well of the second conductivity type positioned beneath the first lowly-doped well, and positioned at least partially beneath the second lowly-doped well and the third lowly-doped well;
   wherein the combination of the second lowly-doped well, the third lowly-doped well, and the fourth lowly-doped well at least partially surround the first lowly-doped well.

17. The ESD protection circuit of claim 1, further comprising:
   a third lowly-doped well of the second conductivity type;
   a fourth lowly-doped well of the second conductivity type positioned beneath the first lowly-doped well, the second lowly-doped well, and the third lowly-doped well; and
   a fifth lowly-doped well of the first conductivity type positioned between the fourth lowly-doped well and the second lowly-doped well;
   wherein the combination of the third lowly-doped well and the fourth lowly-doped well at least partially surround the first lowly-doped well, the second lowly-doped well, and the fifth lowly-doped well.

18. The ESD protection circuit of claim 1, wherein:
   the first conductivity type is a p-type and the second conductivity type is an n-type.

19. The ESD protection circuit of claim 1, wherein:
   the first conductivity type is an n-type and the second conductivity type is a p-type.

20. The ESD protection circuit of claim 1, further comprising:
   a seventh region of the second conductivity type formed at a junction between the first lowly-doped well and the second lowly-doped well, wherein the seventh region extends at least partially into the first lowly-doped well and the second lowly-doped well, and wherein the trigger circuit comprises the seventh region.

* * * * *